United States Patent
Ahn et al.

(10) Patent No.: US 9,799,606 B2
(45) Date of Patent: Oct. 24, 2017

(54) SEMICONDUCTOR DEVICE AND METHOD OF FABRICATING THE SAME

(71) Applicants: Sang Hoon Ahn, Goyang-si (KR);
Sangho Rha, Seongnam-si (KR);
Jongmin Baek, Suwon-si (KR);
Wookyung You, Suwon-si (KR);
Nae-In Lee, Seoul (KR)

(72) Inventors: Sang Hoon Ahn, Goyang-si (KR);
Sangho Rha, Seongnam-si (KR);
Jongmin Baek, Suwon-si (KR);
Wookyung You, Suwon-si (KR);
Nae-In Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 131 days.

(21) Appl. No.: 14/637,640

(22) Filed: Mar. 4, 2015

(65) Prior Publication Data
US 2015/0287682 A1  Oct. 8, 2015

(30) Foreign Application Priority Data

Apr. 7, 2014 (KR) .................. 10-2014-0041159

(51) Int. Cl.
*H01L 23/532* (2006.01)
*H01L 21/768* (2006.01)
*H01L 23/522* (2006.01)

(52) U.S. Cl.
CPC .... *H01L 23/53295* (2013.01); *H01L 21/7682* (2013.01); *H01L 21/76826* (2013.01); *H01L 21/76832* (2013.01); *H01L 21/76835* (2013.01); *H01L 23/5222* (2013.01); *H01L 23/5226* (2013.01); *H01L 21/76805* (2013.01); *H01L 21/76807* (2013.01); *H01L 21/76885* (2013.01); *H01L 23/53223* (2013.01); *H01L 23/53238* (2013.01); *H01L 23/53266* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,165,890 | A | 12/2000 | Kohl et al. |
| 6,790,761 | B2 | 9/2004 | Sakata |
| 7,473,632 | B2 | 1/2009 | Ueda |
| 7,501,347 | B2 | 3/2009 | Noguchi et al. |

(Continued)

FOREIGN PATENT DOCUMENTS

| | | |
|---|---|---|
| JP | 2008-277437 A | 11/2008 |
| JP | 2009-130126 A | 6/2009 |

(Continued)

*Primary Examiner* — Shaun Campbell
*Assistant Examiner* — Aneta Cieslewicz
(74) *Attorney, Agent, or Firm* — Harness, Dickey & Pierce

(57) ABSTRACT

A semiconductor device includes a first conductive pattern on a substrate, an insulating diffusion barrier layer conformally covering a surface of the first conductive pattern, the insulation diffusion barrier layer exposed by an air gap region adjacent to a sidewall of the first conductive pattern, and a second conductive pattern on the first conductive pattern, the second conductive pattern penetrating the insulating diffusion barrier layer so as to be in contact with the first conductive pattern.

14 Claims, 25 Drawing Sheets

(56) References Cited

U.S. PATENT DOCUMENTS

| | | |
|---|---|---|
| 7,875,982 B2 | 1/2011 | Abe |
| 7,932,168 B2 | 4/2011 | Eun |
| 7,943,509 B2 | 5/2011 | Daamen et al. |
| 7,998,855 B2 | 8/2011 | Chen |
| 8,232,618 B2 | 7/2012 | Breyta et al. |
| 8,298,911 B2 | 10/2012 | Lee |
| 2003/0077893 A1* | 4/2003 | Demolliens ......... H01L 21/7682 438/622 |
| 2003/0170974 A1 | 9/2003 | Sakata |
| 2006/0088975 A1 | 4/2006 | Ueda |
| 2006/0281298 A1 | 12/2006 | Noguchi et al. |
| 2007/0049027 A1* | 3/2007 | Seok ................... H01L 21/3212 438/687 |
| 2007/0173055 A1* | 7/2007 | Ohtsuka ............ H01L 21/76831 438/627 |
| 2009/0045521 A1 | 2/2009 | Abe |
| 2009/0302475 A1 | 12/2009 | Korogi et al. |
| 2010/0029076 A1 | 2/2010 | Daamen et al. |
| 2010/0330804 A1 | 12/2010 | Eun |
| 2011/0076831 A1 | 3/2011 | Chen |
| 2011/0183516 A1 | 7/2011 | Lee |
| 2012/0037962 A1 | 2/2012 | Breyta et al. |
| 2012/0261788 A1 | 10/2012 | Lin et al. |
| 2015/0221541 A1* | 8/2015 | Nemani ............. H01L 21/7682 438/666 |
| 2016/0020140 A1* | 1/2016 | Ryan ................. H01L 21/76802 438/666 |

FOREIGN PATENT DOCUMENTS

| | | |
|---|---|---|
| JP | 2009-135172 A | 6/2009 |
| JP | 2011-243639 A | 12/2011 |
| KR | 102011-0067759 A | 6/2011 |

* cited by examiner

SEMICONDUCTOR DEVICE AND METHOD OF FABRICATING THE SAME

CROSS-REFERENCE TO RELATED APPLICATION

This U.S. non-provisional patent application claims priority under 35 U.S.C. §119 to Korean Patent Application No. 10-2014-0041159, filed on Apr. 7, 2014, in the Korean Intellectual Property Office, the disclosure of which is hereby incorporated by reference in its entirety.

BACKGROUND

1. Field

Some example embodiments of the inventive concepts relate to semiconductor devices and methods of fabricating the same.

2. Description of the Related Art

Semiconductor devices with a relatively high integration degree, high density and low power consumption have been demanded with the development of the electronic industry. A semiconductor device having a relatively high integrated circuit may be designed using a multi-layered interconnection structure. These interconnections may be formed of a metal material such as aluminum. In other words, an aluminum layer may be deposited on an insulating layer, and a patterning process may be performed on the aluminum layer to form an aluminum interconnection.

However, design rules of semiconductor devices have been reduced, so the aluminum interconnections have been replaced with a copper interconnection. The aluminum may have a relatively great electrical resistance, and the electrical resistance of the aluminum interconnection may further increase as a width of the aluminum interconnection decreases. Thus, operating speed of semiconductor devices may be reduced. On the contrary, an electrical resistance of the copper is lower than that of the aluminum, and the copper is inexpensive. Thus, the aluminum interconnections are being replaced with copper interconnections. However, etching the copper by an etching process may be difficult, and thus, the copper interconnections may be formed using a damascene process.

Spaces between interconnections have been reduced by the high integration degree of semiconductor devices. Thus, even though materials of the interconnections are changed as described above, an interference phenomenon may be caused between the interconnections to delay signal transfer speeds of the interconnections.

SUMMARY

Some example embodiments of the inventive concepts may provide semiconductor devices capable of improving a signal transfer speed thereof.

Other example embodiments of the inventive concepts may also provide methods of fabricating a semiconductor device capable of preventing or reducing a bridge problem caused by misalignment.

According to an example embodiment, a semiconductor device includes a first conductive pattern on a substrate, an insulating diffusion barrier layer conformally covering a surface of the first conductive pattern, the insulation diffusion barrier layer exposed by an air gap region adjacent to a sidewall of the first conductive pattern, and a second conductive pattern on the first conductive pattern, the second conductive pattern penetrating the insulating diffusion barrier layer so as to be in contact with the first conductive pattern.

In an example embodiment, a portion of a bottom surface of the second conductive pattern may be exposed by the air gap region.

In an example embodiment, the semiconductor device may further include a sacrificial-layer residue in contact with a bottom surface of the second conductive pattern.

In an example embodiment, the sacrificial-layer residue may be formed of a hydrocarbon layer.

In an example embodiment, the semiconductor device may further include an upper interlayer insulating layer in contact with a sidewall of the second conductive pattern. The upper interlayer insulating layer may include a porous layer.

In an example embodiment, the upper interlayer insulating layer may include a porous silicon oxy hydrocarbon (SiOCH) layer.

In an example embodiment, the upper interlayer insulating layer may include a glue layer, a high-density interlayer insulating layer, and a low-density interlayer insulating layer which are sequentially stacked.

In an example embodiment, the semiconductor device may further include a permeation layer under the upper interlayer insulating layer.

In an example embodiment, the substrate may include a first region and a second region, the first conductive pattern in the first region may include a plurality of first region conductive patterns laterally spaced apart from each other at a first distance, the first conductive pattern in the second region may include a plurality of second region conductive patterns laterally spaced apart from each other at a second distance greater than the first distance, and the air gap region may be between the plurality of first region conductive patterns.

In an example embodiment, the semiconductor device may further include a lower interlayer insulating layer filling a space between the plurality of second region conductive patterns.

In an example embodiment, the semiconductor device may further include a capping pattern on the lower interlayer insulating layer.

In an example embodiment, a mechanical strength of the capping pattern may be stronger than a mechanical strength of the lower interlayer insulating layer.

In an example embodiment, at least a portion of the second conductive pattern may vertically overlap with the air gap region.

According to another example embodiment, a method of fabricating a semiconductor device includes forming first conductive patterns spaced apart from each other on a substrate, forming a sacrificial layer filling a space between the first conductive patterns, forming an upper interlayer insulating layer on the first conductive patterns and the sacrificial layer, forming a second conductive pattern in the upper interlayer insulating layer, the second conductive pattern in contact with at least one of the first conductive patterns, and removing the sacrificial layer to form an air gap region.

In another example embodiment, the sacrificial layer may be formed of a hydrocarbon layer.

In another example embodiment, the upper interlayer insulating layer may include a porous layer, and removing the sacrificial layer may include irradiating an ultraviolet ray to an entire top surface of the substrate.

In another example embodiment, forming the upper interlayer insulating layer may include forming a silicon oxy hydrocarbon (SiOCH) layer including porogens dispersed therein, and hardening the silicon oxy hydrocarbon layer and removing the porogens to form pores simultaneously.

In another example embodiment, hardening the silicon oxy hydrocarbon layer may include performing at least one of a remote hydrogen ($H_2$) plasma treatment process, an electron beam irradiating process, and an ultraviolet irradiating process.

In another example embodiment, the process for hardening the silicon oxy hydrocarbon layer includes a first energy, the process for removing the sacrificial layer includes a second energy, and the first energy is less than the second energy.

In another example embodiment, the porogens and the sacrificial layer may be formed of materials different from each other.

In another example embodiment, forming the first conductive patterns may include forming a lower interlayer insulating layer on the substrate, forming the first conductive patterns in the lower interlayer insulating layer, and removing at least a portion of the lower interlayer insulating layer between the first conductive patterns.

In another example embodiment, the lower interlayer insulating layer may include carbon, and removing at least a portion of the lower interlayer insulating layer may include performing a plasma treatment process on the lower interlayer insulating layer to remove the carbon, and removing the lower interlayer insulating layer from which the carbon has been removed.

In another example embodiment, removing the sacrificial layer may expose at least a portion of a bottom surface of the second conductive pattern.

In another example embodiment, removing the sacrificial layer may form the air gap region vertically overlapping at least a portion of the second conductive pattern.

According to yet another example embodiment, a semiconductor device includes a plurality of first conductive patterns on a substrate, the plurality of first conductive patterns including a plurality of first region conductive patterns on a first region of the substrate, the plurality of first region conductive patterns including air gap regions therebetween, and a plurality of second region conductive patterns on a second region of the substrate, the plurality of second region conductive patterns including a porous layer therebetween, and a plurality of second conductive patterns over at least the plurality of first region conductive patterns, at least one of the plurality of second conductive patterns in contact with at least one of the plurality of first region conductive patterns.

In yet another example embodiment, the semiconductor device may further include an insulating diffusion barrier layer conformally covering at least one surface of the plurality of first region conductive patterns, wherein the insulation diffusion barrier layer and a portion of a bottom surface of the second conductive pattern in contact with the first region conductive pattern may be exposed by the air gap regions between the plurality of first region conductive patterns.

In yet another example embodiment, the porous layer between the plurality of second region conductive patterns may be a porous silicon oxy hydrocarbon (SiOCH) layer.

In yet another example embodiment, the semiconductor device may further include an upper interlayer insulating layer in contact with a sidewall of the plurality of second conductive patterns, wherein the upper interlayer insulating layer may include a porous silicon oxy hydrocarbon (SiOCH) layer.

In yet another example embodiment, the semiconductor device may further include a permeation layer under the upper interlayer insulating layer.

In yet another example embodiment, the plurality of first region conductive patterns may be laterally spaced apart from each other at a first distance, and the plurality of second region conductive patterns may be laterally spaced apart from each other at a second distance greater than the first distance.

In yet another example embodiment, at least a portion of the second conductive pattern in contact with the first region conductive pattern may vertically overlap the air gap regions.

BRIEF DESCRIPTION OF THE DRAWINGS

The inventive concepts will become more apparent in view of the attached drawings and accompanying detailed description.

DETAILED DESCRIPTION

Figure 1:
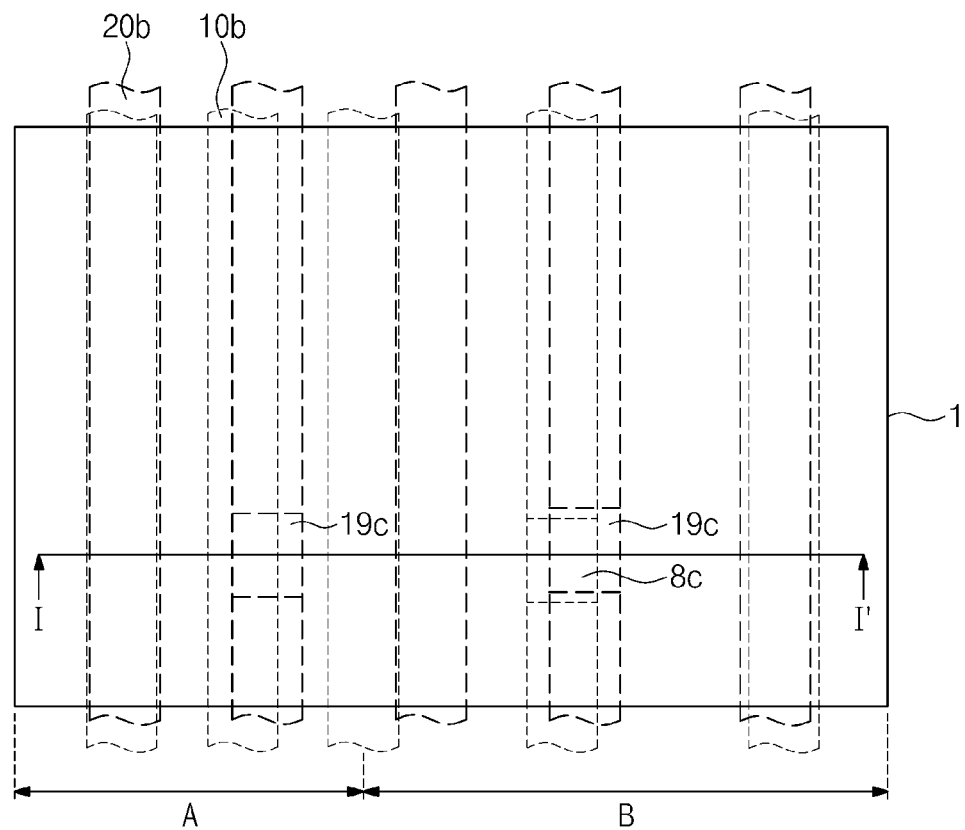
FIG. 1 is a plan view illustrating a semiconductor device according to an example embodiment of the inventive concepts.

The inventive concepts will now be described more fully hereinafter with reference to the accompanying drawings, in which some example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, some example embodiments of the inventive concepts are not limited to the specific examples provided herein and are exaggerated for clarity.

The terminology used herein is for the purpose of describing particular example embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiments in the detailed description will be described with sectional views as ideal example views of the inventive concepts. Accordingly, shapes of the example views may be modified according to manufacturing techniques and/or allowable errors. Therefore, the example embodiments of the inventive concepts are not limited to the specific shape illustrated in the example views, but may include other shapes that may be created according to manufacturing processes. Areas illustrated in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other example embodiments without departing from the teachings of the inventive concepts. Example embodiments of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
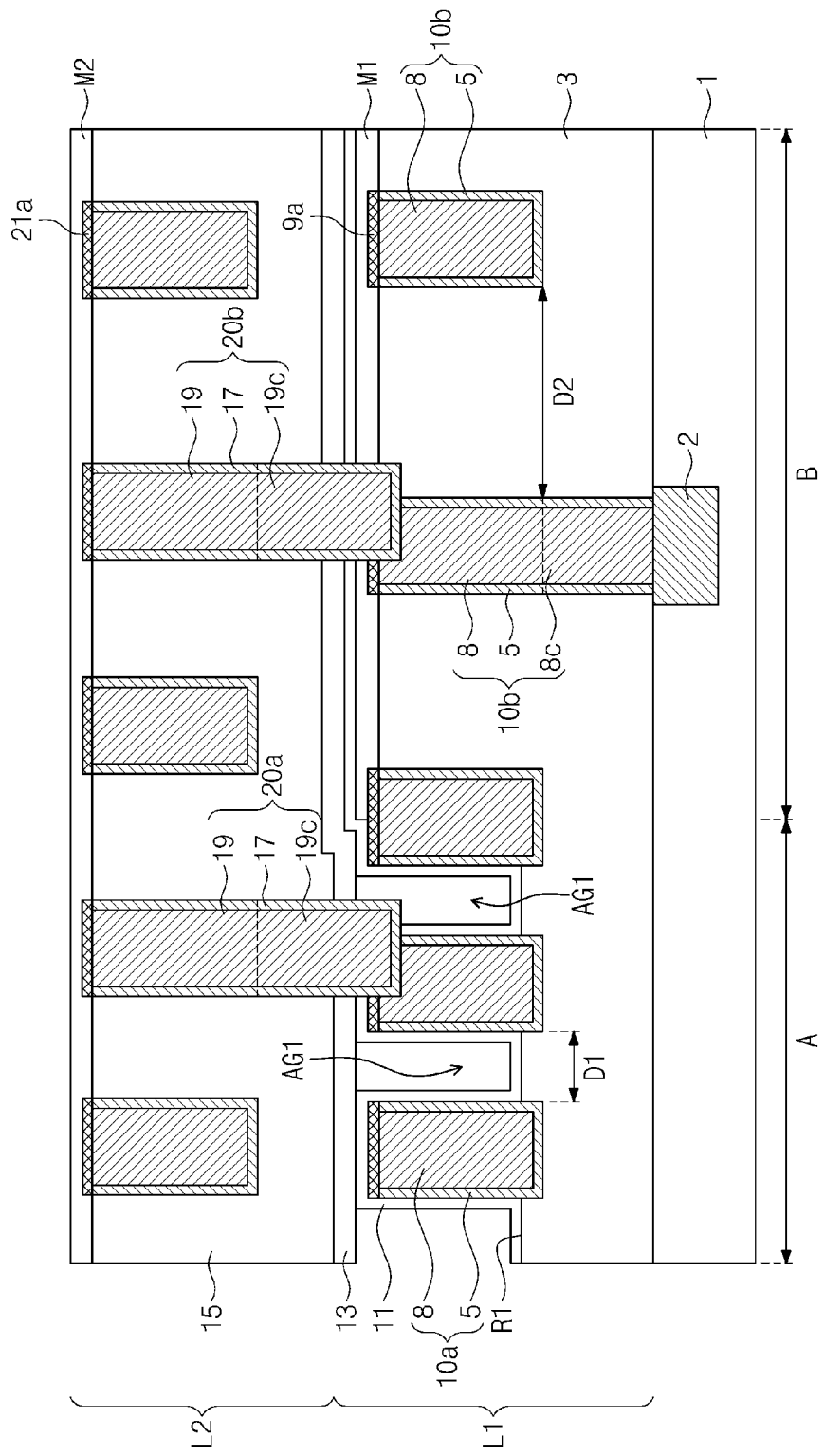
FIG. 2 is a cross-sectional view taken along a line I-I' of FIG. 1.

FIG. 1 is a plan view illustrating a semiconductor device according to an example embodiment of the inventive concepts. FIG. 2 is a cross-sectional view taken along a line I-I' of FIG. 1.

Referring to FIGS. 1 and 2, a substrate 1 including a first region A and a second region B is provided. Even though not shown in the drawings, a device isolation layer (not shown) and transistors (not shown) may be disposed on the substrate 1. The substrate 1 may include a conductive portion 2. The conductive portion 2 may correspond to a gate electrode or a source/drain region of a transistor or an interconnection such as a common source line. Alternatively, the substrate 1 may include an insulating layer, and the conductive portion 2 may correspond to a conductive pattern (e.g., an interconnection, a pad, a contact plug, or a via-plug) disposed in the insulating layer. A first interconnection layer L1 and a second interconnection layer L2 are sequentially stacked on the substrate 1.

The first interconnection layer L1 includes a first interlayer insulating layer 3. The first interlayer insulating layer 3 may be formed of a material having an ultralow dielectric constant (an ultralow-k). For example, the first interlayer insulating layer 3 may be formed of a porous silicon oxy hydrocarbon (porous SiOCH). A recess region R1 is formed in the first interlayer insulating layer 3 of the first region A. First conductive patterns 10a are disposed in the recess region R1, and second conductive patterns 10b are disposed in the first interlayer insulating layer 3 of the second region B. Hereinafter, the first conductive pattern 10a of the first interconnection layer L1 is referred to as 'a first-layer first conductive pattern 10a', and the second conductive pattern 10b of the first interconnection layer L1 is referred to as 'a first-layer second conductive pattern 10b'.

The first-layer first conductive patterns 10a may be interconnections that are spaced apart from each other at first distances D1 and are parallel to each other. The first-layer second conductive patterns 10b may be interconnections that are spaced apart from each other at second distances D2 and are parallel to each other. Each of the first-layer first conductive patterns 10a and the first-layer second conductive patterns 10b may include a first interconnection portion 8 and a first metal diffusion barrier layer 5 conformally covering at least a sidewall of the first interconnection portion 8. At least one of the first-layer second conductive patterns 10b may include the first metal diffusion barrier layer 5 conformally covering also a bottom surface of the first interconnection portion 8. The first interconnection portion 8 may be formed of, for example, a metal such as copper, aluminum, and/or tungsten. The first metal diffusion barrier layer 5 may be formed of at least one of titanium (Ti), a titanium nitride (TiN), tantalum (Ta), tantalum nitride (TaN), ruthenium (Ru), cobalt (Co), manganese (Mn), tungsten nitride (WN), nickel (Ni), or nickel boride (NiB).

At least one of the first-layer second conductive patterns 10b may further include a first conductive plug 8c extending to the first conductive portion 2. The first conductive plug 8c may correspond to a contact plug or a via-plug. The first conductive plug 8c may be formed of the same material as the first interconnection portion 8. Each of top surfaces of the first-layer first and second conductive patterns 10a and 10b is covered with a first protecting layer 9a. The first protecting layer 9a may be formed of a metal or metal nitride including at least one of tantalum, ruthenium, cobalt, manganese, titanium, tungsten, nickel, or aluminum.

The first interlayer insulating layer 3 of the second region B is covered with a first capping pattern M1. The first capping pattern M1 may be formed of at least one of silicon carbonitride (SiCN), silicon nitride (SiN), or silicon oxycarbide (SiOC). A mechanical strength (or a Moh's hardness) of the first capping pattern M1 may be stronger than a mechanical strength (or a Moh's hardness) of the first interlayer insulating layer 3. An insulating diffusion barrier layer 11 conformally covers a top surface of the first capping pattern M1. The insulating diffusion barrier layer 11 may be formed of at least one of silicon carbonitride (SiCN), silicon nitride (SiN), or silicon oxycarbide (SiOC).

The insulating diffusion barrier layer 11 extends into the first region A to cover the sidewalls of the first-layer first conductive patterns 10a, top surfaces of the first protecting layers 9a disposed on the first conductive patterns 10a, and a bottom surface of the recess region R1. The insulating diffusion barrier layer 11 may prevent or reduce diffusion of copper and may function as a barrier with respect to water or moisture. An air gap region AG1 is disposed in a space between the first-layer first conductive patterns 10a in the first region A. In the second region B, a space between the first-layer second conductive patterns 10b is filled with the first interlayer insulating layer 3. The first interlayer insulating layer 3 is formed of the porous SiOCH, so a dielectric constant of the first interlayer insulating layer 3 is lower than that of a silicon oxide layer. The second distance D2 may be greater than the first distance D1. In other words, the space between the first-layer second conductive patterns 10b of the second region B may be wider than the space between the first-layer first conductive patterns 10a of the first region A. In the second region B, even though the relatively wide space between the first-layer second conductive patterns 10b is filled with the porous SiOCH without an air gap region, an interference problem between the first-layer second conductive patterns 10b may rarely occur. In addition, since the first interlayer insulating layer 3 fills the space between the second conductive patterns 10b, the mechanical strength of the semiconductor device may be increased.

A permeation layer 13 is disposed on the insulating diffusion barrier layer 11. The permeation layer 13 may be formed of silicon oxide or a porous SiOCH. The permeation layer 13 formed of the silicon oxide may be thinner than the permeation layer 13 formed of the porous SiOCH. The air gap region AG1 may be defined by a bottom surface of the permeation layer 13 and a side surface and a bottom surface of the insulating diffusion barrier layer 11. The bottom surface of the permeation layer 13 may be flat.

The second interconnection layer L2 includes a second interlayer insulating layer 15. The second interlayer insulating layer 15 may be formed of the same material as the first interlayer insulating layer 3. The second interconnection layer L2 includes first conductive patterns 20a disposed in the second interlayer insulating layer 15 of the first region A and second conductive patterns 20b disposed in the second interlayer insulating layer 15 of the second region B. Hereinafter, the first conductive pattern 20a of the second interconnection layer L2 is referred to as 'a second-layer first conductive pattern 20a', and the second conductive pattern 20b of the second interconnection layer L2 is referred to as 'a second-layer second conductive pattern 20b'. A distance between the second-layer first conductive patterns 20a may be randomly determined, and a distance between the second-layer second conductive patterns 20b may also be randomly determined. Each of the second-layer first and second conductive patterns 20a and 20b includes a second interconnection portion 19 and a second metal diffusion barrier layer 17 surrounding a sidewall and a bottom surface of the second interconnection portion 19. Some of the second-layer first and second conductive patterns 20a and 20b may further include second conductive plugs 19c respectively extending to the first-layer first conductive pattern 10a and the first-layer second conductive pattern 10b and may be in contact with the first-layer first conductive pattern 10a and the first-layer second conductive pattern 10b, respectively. The second conductive plug 19c may be a via-plug. A height of a bottom surface of the second-layer first conductive pattern 20a being in contact with the first-layer first conductive pattern 10a may be the same as a height of the bottom surface of the second-layer second conductive pattern 20b being in contact with the first-layer second conductive pattern 10b. The bottom surface and a bottom corner of the second-layer first conductive pattern 20a being in contact with the first-layer first conductive pattern 10a may be exposed by the air gap region AG1. The second interlayer insulating layer 15 may be covered with a second capping pattern M2. Materials of elements constituting the second interconnection layer L2 may be the same as or similar to the materials of the elements constituting the first interconnection layer L1, respectively.

In the semiconductor device of FIG. 2, the air gap region AG1 may also be disposed around the first-layer first conductive pattern 10a connected to the second conductive plug 19c. Thus, an area of the air gap region may be relatively increased. Since a dielectric constant of the air gap region AG1 is almost 1, the signal transfer speed through the interconnections may be improved.

A method of fabricating the semiconductor device of FIG. 2 will be described. FIGS. 3 to 13 are cross-sectional views illustrating a method of fabricating the semiconductor device of FIG. 2.

Figure 3:
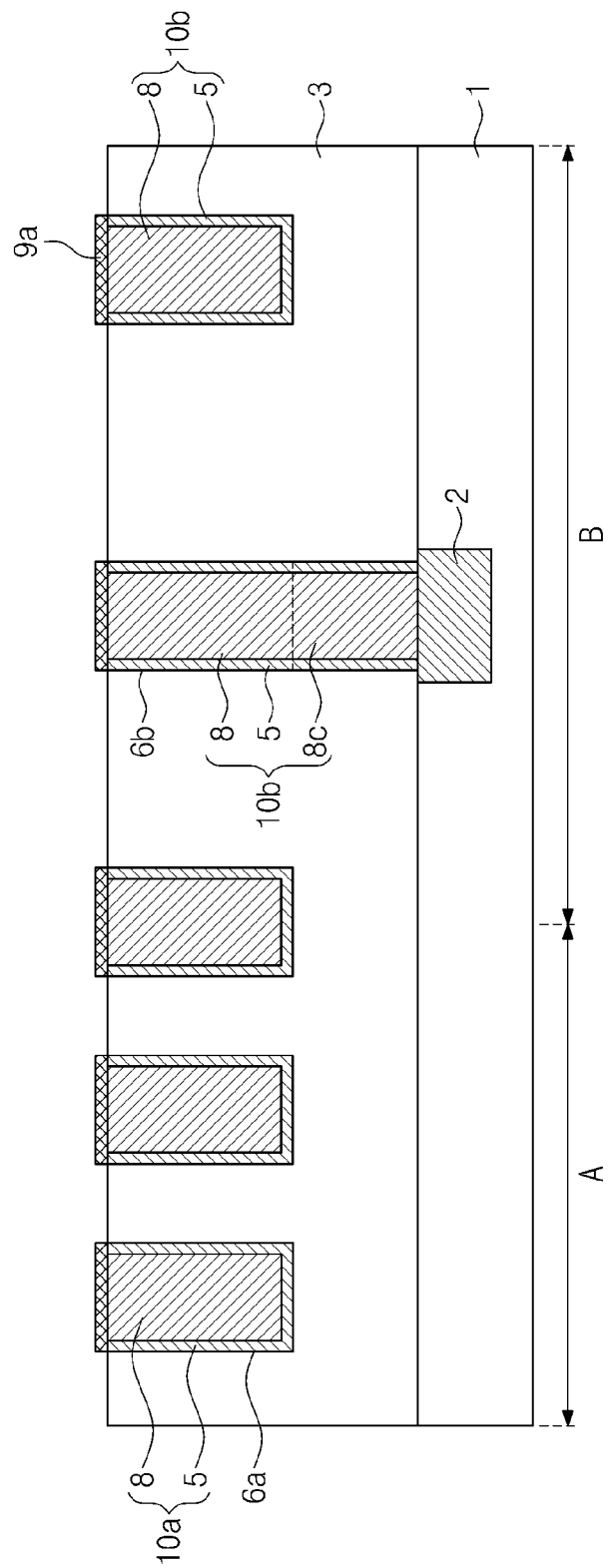
FIGS. 3 to 13 are cross-sectional views illustrating a method of fabricating the semiconductor device of FIG. 2.

Referring to FIG. 3, a substrate 1 including a first region A and a second region B is prepared. A conductive portion 2 is formed in the substrate 1. A first interlayer insulating layer 3 is formed on the first substrate 1. The first interlayer insulating layer 3 may be formed of a material having an ultralow dielectric constant (an ultralow-k). For example, the first interlayer insulating layer 3 may be formed of a porous silicon oxy hydrocarbon (porous SiOCH) layer. The process of the first interlayer insulating layer 3 may be the same as or similar to a subsequent process of forming a second interlayer insulating layer 15. The process of forming the second interlayer insulating layer 15 will be described later. First-layer first and second grooves 6a and 6b are formed in the first interlayer insulating layer 3, and a first metal diffusion barrier layer 5 is conformally formed on at least a sidewall of the first and second grooves 6a and 6b. A conductive layer is formed to fill the first-layer first and second grooves 6a and 6b. The conductive layer is planarized to form the first interconnection 8 of the first-layer first and second conductive patterns 10a and 10b and to expose a top surface of the first interlayer insulating layer 3. At least one of the first-layer second conductive patterns 10b may further include a first conductive plug 8c extending to the first conductive portion 2. The first conductive plug 8c may correspond to a contact plug or a via-plug. A first protecting layer 9a is formed on each of the first-layer first and second conductive patterns 10a and 10b.

Figure 4:
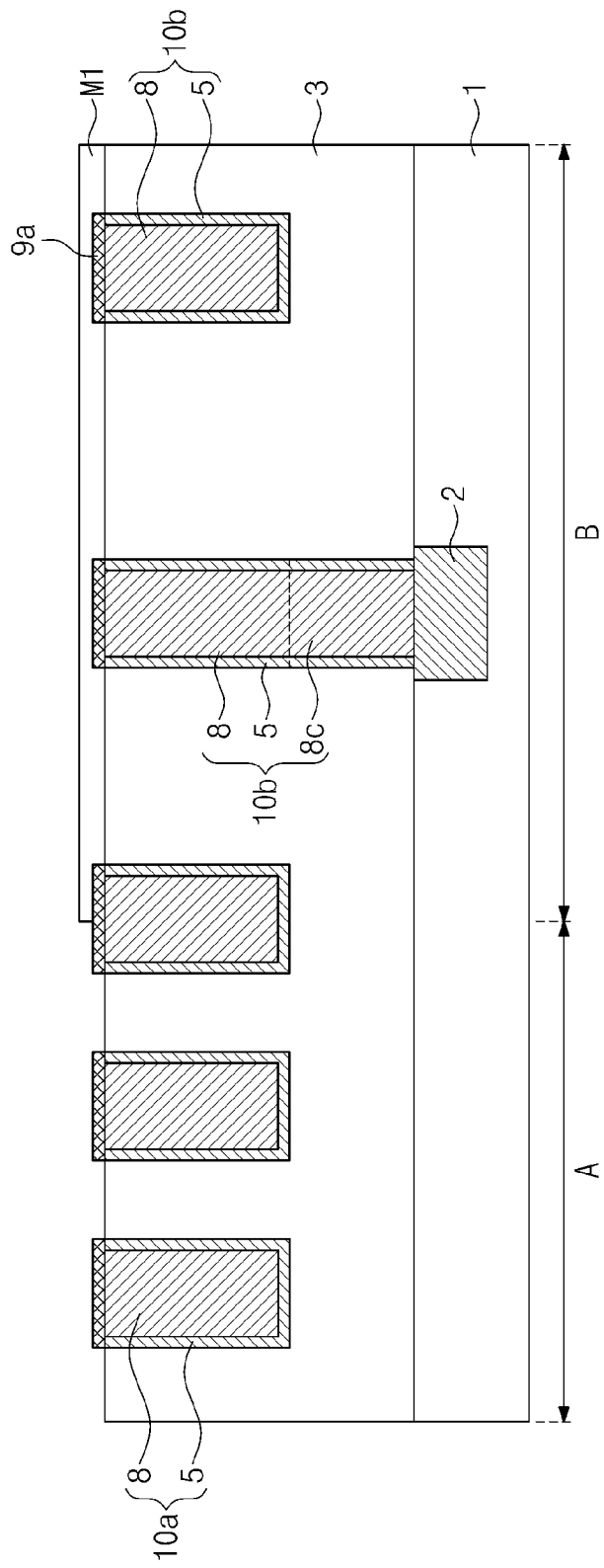

Referring to FIG. 4, a first capping pattern M1 is formed on the substrate 1. The first capping pattern M1 covers the first-layer second conductive patterns 10b and the first interlayer insulating layer 3 of the second region B but exposes the first-layer first conductive patterns 10b and the first interlayer insulating layer 3 of the first region A.

Figure 5:
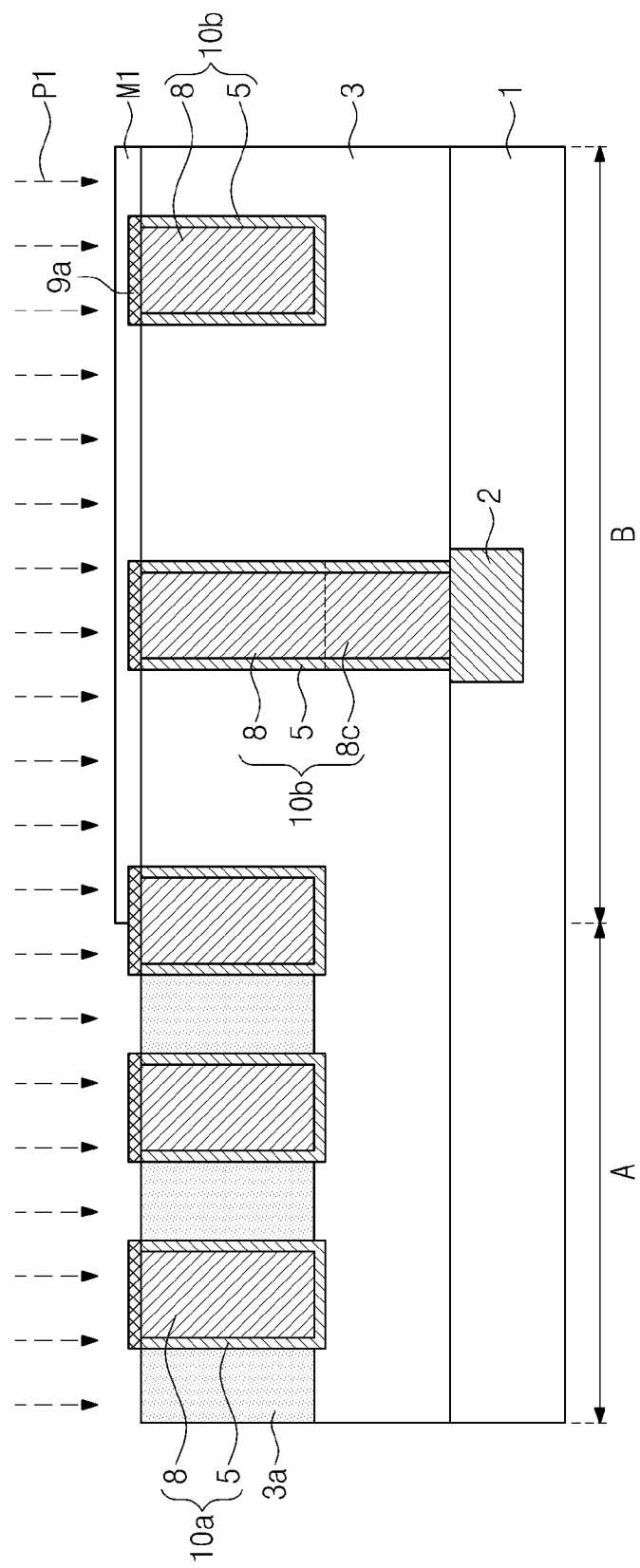

Referring to FIG. 5, a plasma treatment process P1 is performed on an entire top surface of the substrate 1. The plasma treatment process P1 may be performed using, for example, ammonia. During the plasma treatment process P1, the first interlayer insulating layer 3 of the second region B may be protected by the first capping pattern M1 but the first interlayer insulating layer 3 of the first region A, which is not covered by the first capping pattern M1, may be treated by plasma. Carbon may be removed from a portion of the first interlayer insulating layer 3 of the first region A by the plasma treatment process P1, so the portion of the first interlayer insulating layer 3 may be converted into a first interlayer insulating layer 3a formed of silicon hydroxide (SiOH). A thickness of the first interlayer insulating layer 3a treated by the plasma may be controlled by controlling a recipe (e.g., energy and/or a process time) of the plasma treatment process P1.

Figure 6:
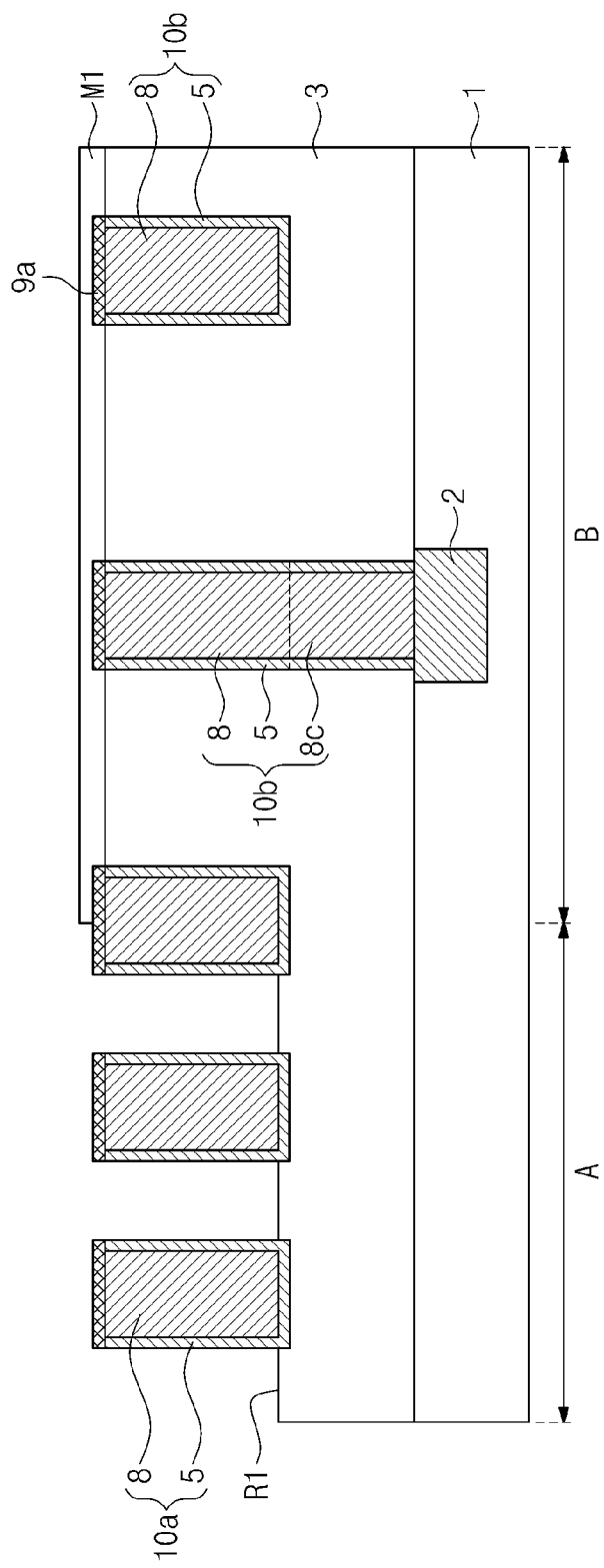

Referring to FIG. 6, the first interlayer insulating layer 3a treated by the plasma may be removed to form a recess region R1 in the first region A. The silicon hydroxide (SiOH) from which the carbon is removed may be removed by, for example, hydrofluoric acid. Thus, sidewalls of the first-layer first conductive patterns 10a may be exposed in the first region A. The first interlayer insulating layer 3 not treated by the plasma is not removed by the hydrofluoric acid.

Figure 7:
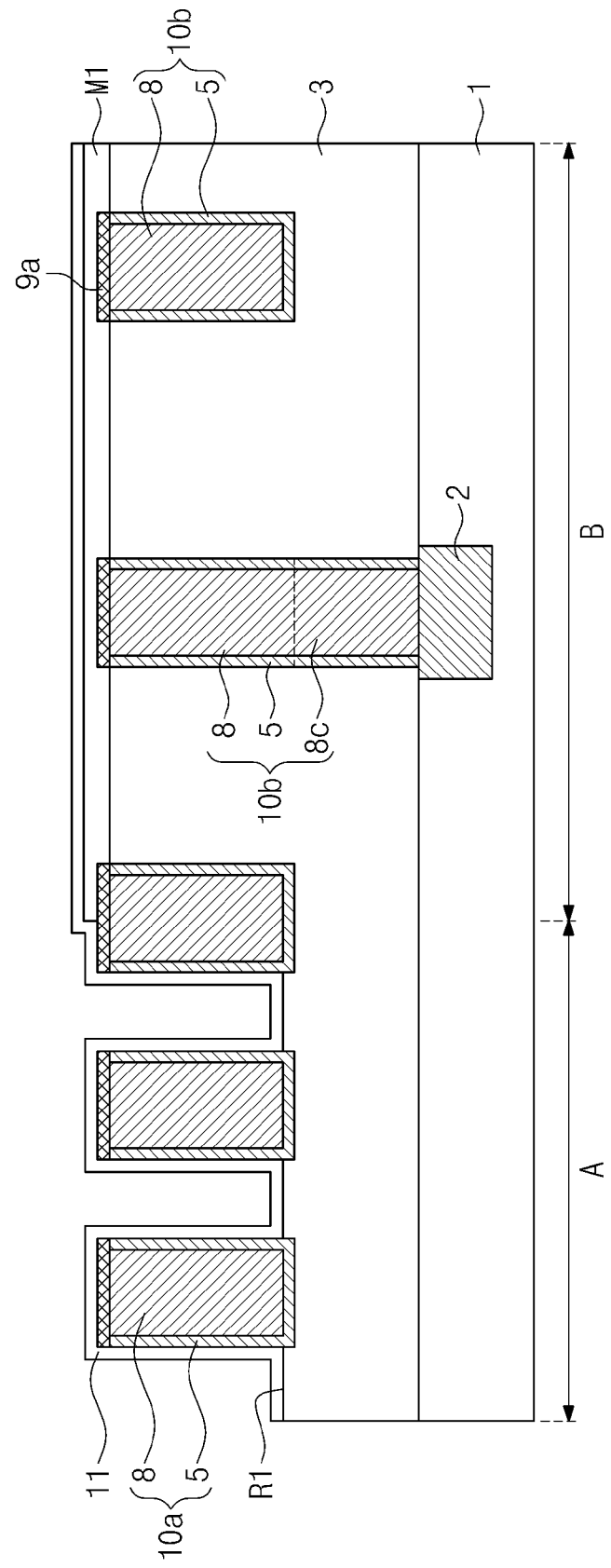

Referring to FIG. 7, an insulating diffusion barrier layer 11 is conformally formed on an entire top surface of the substrate 1. The insulating diffusion barrier layer 11 does not close a space between top ends of the first-layer first conductive patterns 10a adjacent to each other.

Figure 8:
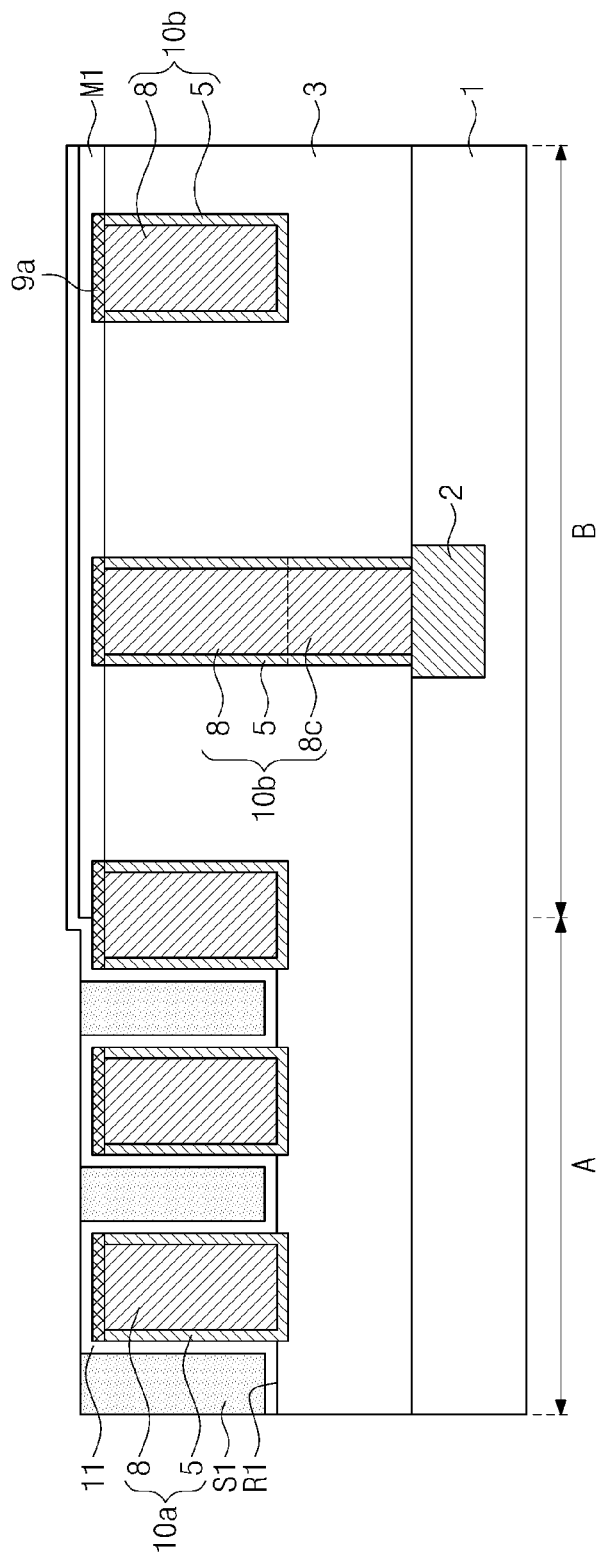

Referring to FIG. 8, a sacrificial layer S1 is formed to fill each of spaces between the first-layer first conductive patterns 10a in the first region A. The sacrificial layer S1 may be formed of a hydrocarbon layer using a spin coating method or a chemical vapor deposition (CVD) process. If the sacrificial layer S1 is formed on the first-layer first conductive patterns 10a and/or in the second region B, an etch back process may be performed to locally form the sacrificial layer S1 in each of the spaces between the first-layer first conductive patterns 10a.

Figure 9:
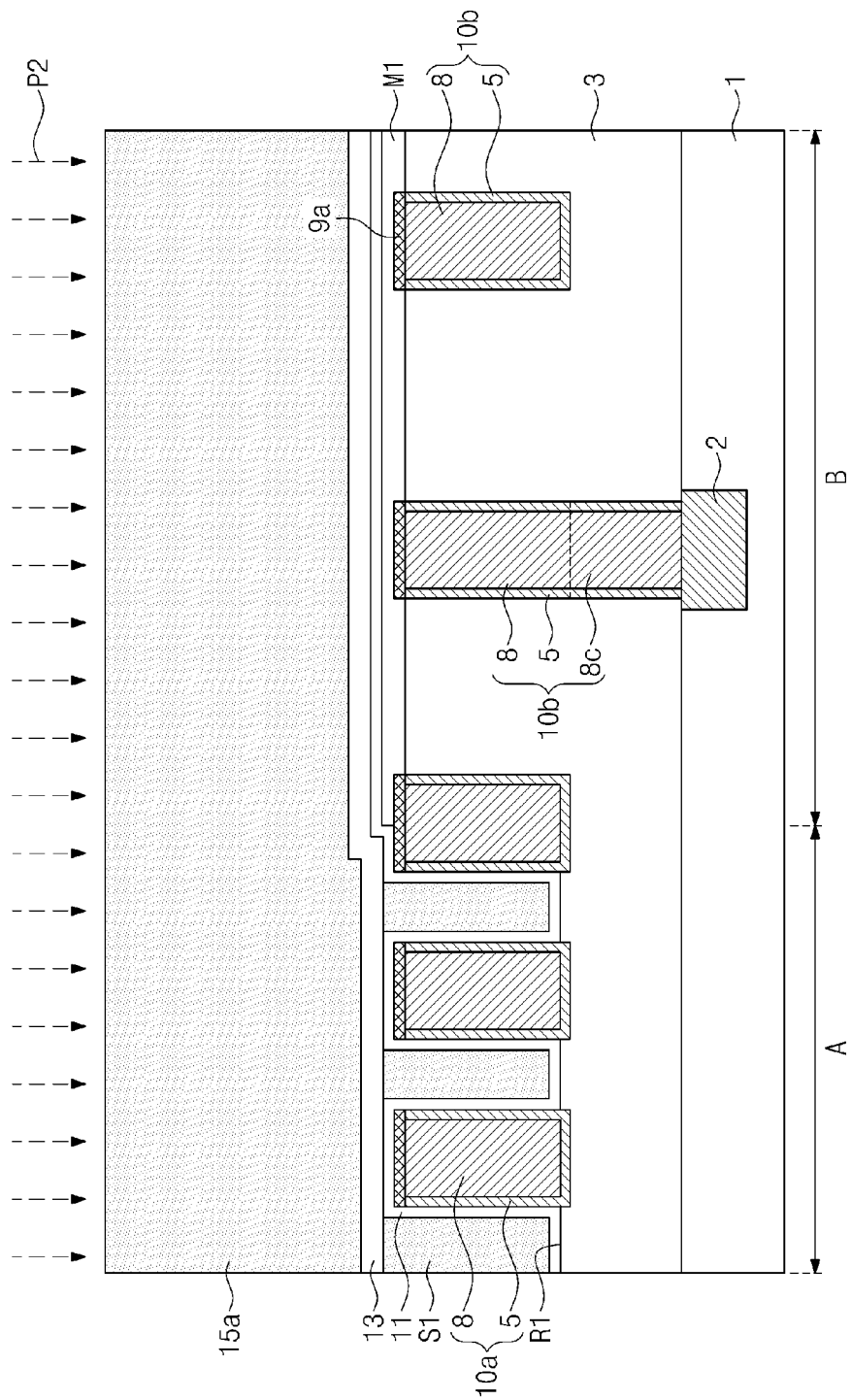

Referring to FIG. 9, a permeation layer 13 is formed on the substrate 1. The permeation layer 13 may be formed of a silicon oxide layer or a porous layer. The permeation layer 13 formed of the silicon oxide layer may be thinner than the permeation layer 13 formed of the porous layer. If the permeation layer 13 is formed of the porous layer, the permeation layer 13 may be formed of, for example, a porous silicon oxy hydrocarbon (porous SiOCH) layer.

Figure 10:
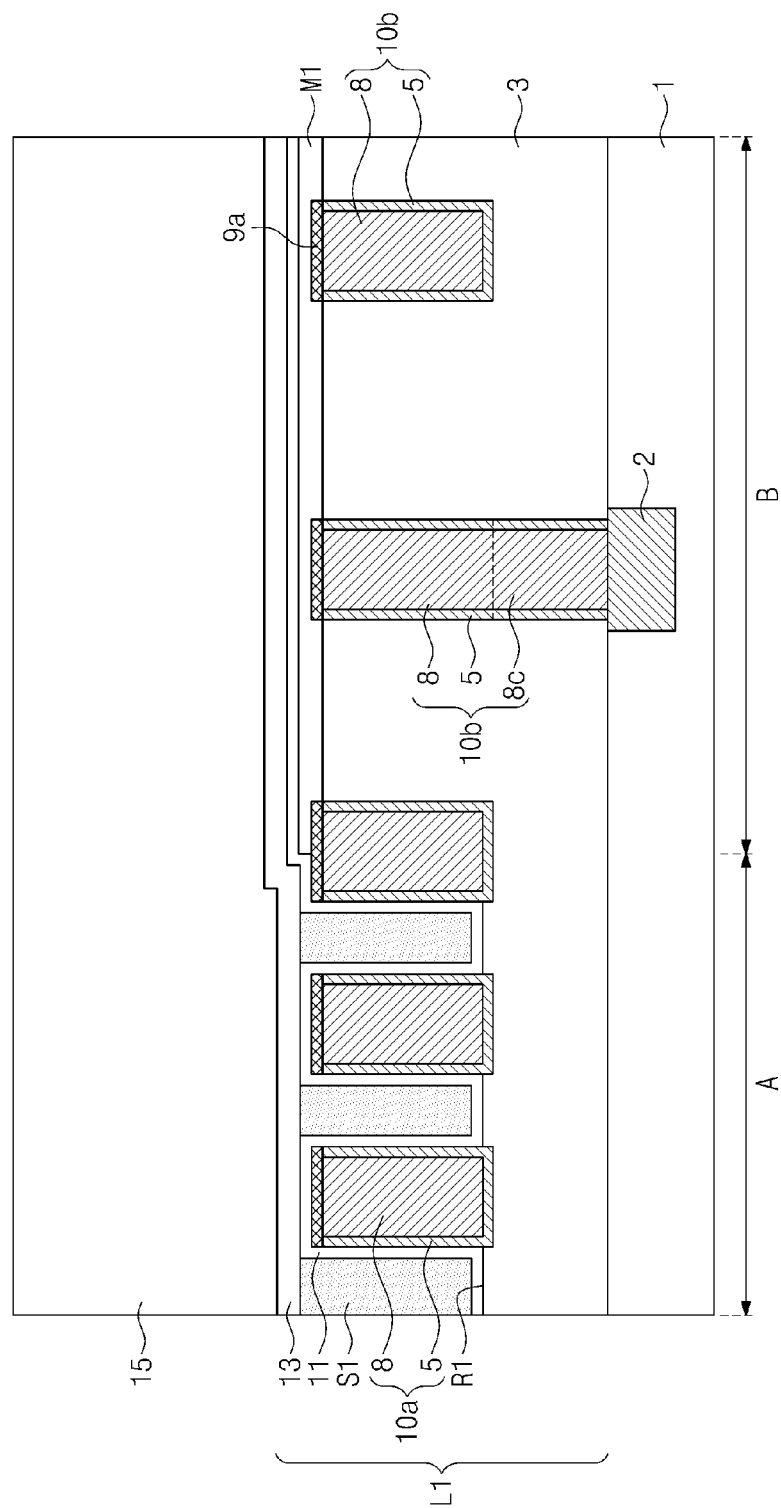

Referring to FIGS. 9 and 10, a second interlayer insulating layer 15 is formed on the permeation layer 13. The second interlayer insulating layer 15 may be formed of a material having an ultralow dielectric constant (an ultralow-k) like the first interlayer insulating layer 3. For example, the second interlayer insulating layer 15 may be formed of a porous SiOCH layer. In some embodiments, a silicon oxy hydrocarbon (SiOCH) layer 15a in which porogens (polymeric pore generators) such as hydrocarbon particles are dispersed may be formed as illustrated in FIG. 9. A hardening process P2 is performed on the SiOCH layer 15a. During the hardening process P2, the porogens are removed to form pores and the SiOCH layer 15a is hardened. Removing the porogens may include breaking the hydrocarbon particles using a volatile by-product such as methane or ethane. The sacrificial layer S1 is not removed during the hardening process P2. A process depth (or a hardening depth) of the hardening process P2 may be controlled to leave the sacrificial layer S1. The hardening process P2 capable of controlling the process depth may be a remote hydrogen ($H_2$) plasma treatment process or an electron beam irradiating process. Alternatively, the hardening process P2 may be an ultraviolet irradiating process. If the ultraviolet irradiating process is used as the hardening process P2, the process depth may be difficult to control. Thus, in this case, an irradiating energy of an ultraviolet ray may be lowered, and a chemical material of the hydrocarbon layer of the sacrificial layer S1 may be different from a chemical material of the hydrocarbon particles of the SiOCH layer 15a. In other words, the hydrocarbon layer of the sacrificial layer S1 may be formed of a chemical material that is not decomposed during the irradiation of the low-energy ultraviolet ray. As described above, the second interlayer insulating layer 15 including the porous SiOCH is formed by the hardening process P2. The second interlayer insulating layer 15 may be more hardened by the hardening process P2.

Figure 11:
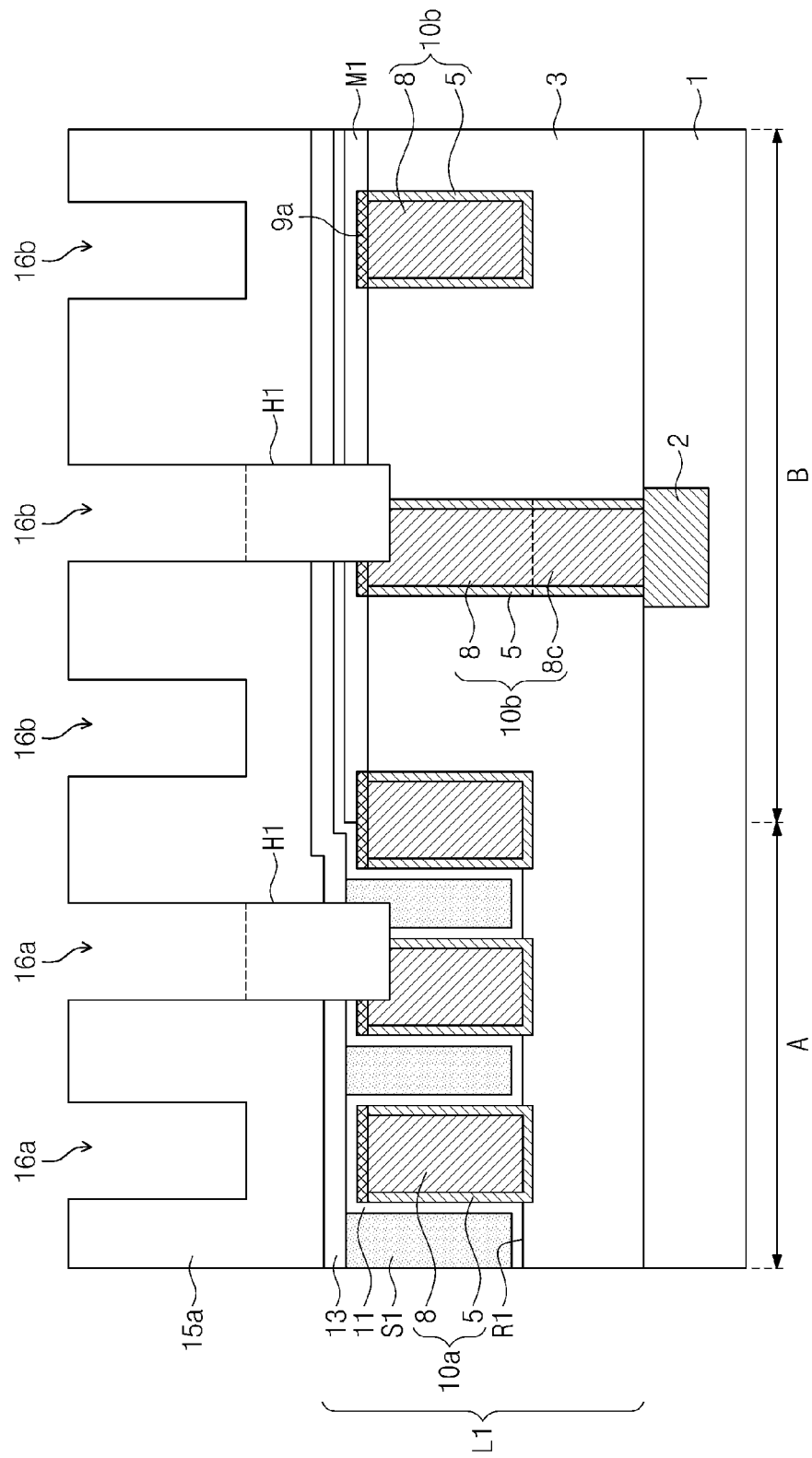

Referring to FIG. 11, the second interlayer insulating layer 15 may be etched to form second-layer first and second grooves 16a and 16b. Some of the second-layer first and second grooves 16a and 16b may include holes H1 exposing the first-layer first conductive pattern 10a and the first-layer second conductive pattern 10b, respectively. The permeation layer 13 and the insulating diffusion barrier layer 11 disposed under the second interlayer insulating layer 15 may also be etched to form the holes H1. In the second region B, the first capping pattern M1 may also be etched. When the holes H1 are formed, misalignment may occur. Thus, the hole H1 of the first region A may expose the sacrificial layer S1 as well as the first-layer first conductive pattern 10a. If an air gap region is formed between the first-layer first conductive patterns 10a in advance without the sacrificial layer S1 and the misalignment occurs, the hole H1 may expose the air gap region. In this case, the first interlayer insulating layer 3 under the first-layer first conductive patterns 10a may also be etched to expose undesired interconnections. If a conductive layer for formation of subsequent conductive patterns is formed, a bridge may occur between the undesired interconnections. However, according to example embodiments of the inventive concepts, since the sacrificial layer S1 is formed between the first-layer first conductive patterns 10a, the holes H1 do not have excessive depths and/or undesired shapes. As a result, the bridge caused by the misalignment may be prevented or reduced.

Figure 12:
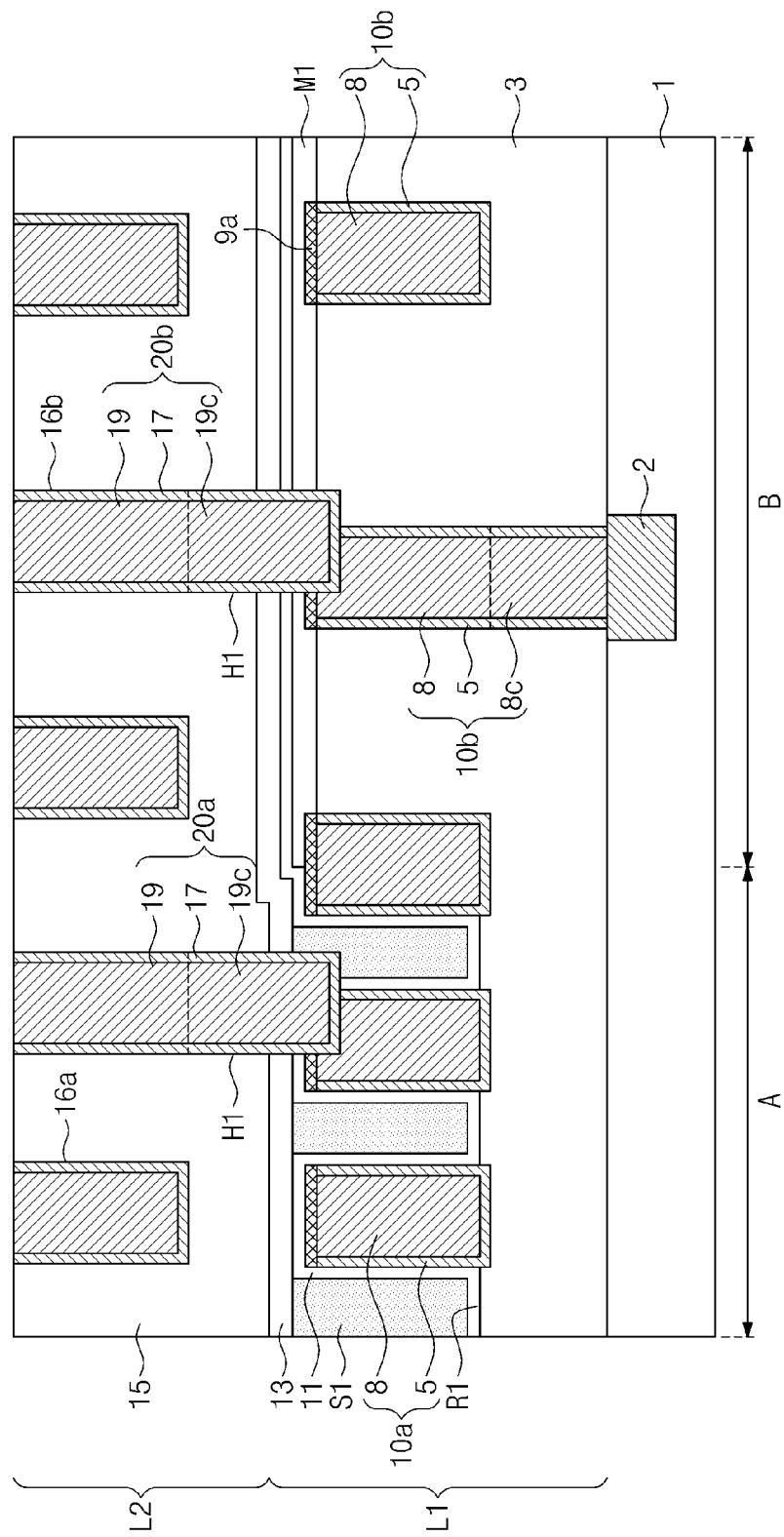

Referring to FIG. 12, a second metal diffusion barrier layer 17 may be conformally formed on the substrate 1, and a conductive layer may be formed to fill the second-layer first and second grooves 16a and 16b. The conductive layer may be planarized to form the second interconnection 19 of the second-layer first and second conductive patterns 20a and 20b. Some of the second-layer first and second conductive patterns 20a and 20b may further include second conductive plugs 19c respectively extending to the first-layer first conductive pattern 10a and the first-layer second conductive pattern 10b and may be in contact with the first-layer first conductive pattern 10a and the first-layer second conductive pattern 10b, respectively. The second conductive plug 19c may be a via-plug. Thus, a second interconnection layer L2 is formed.

Figure 13:
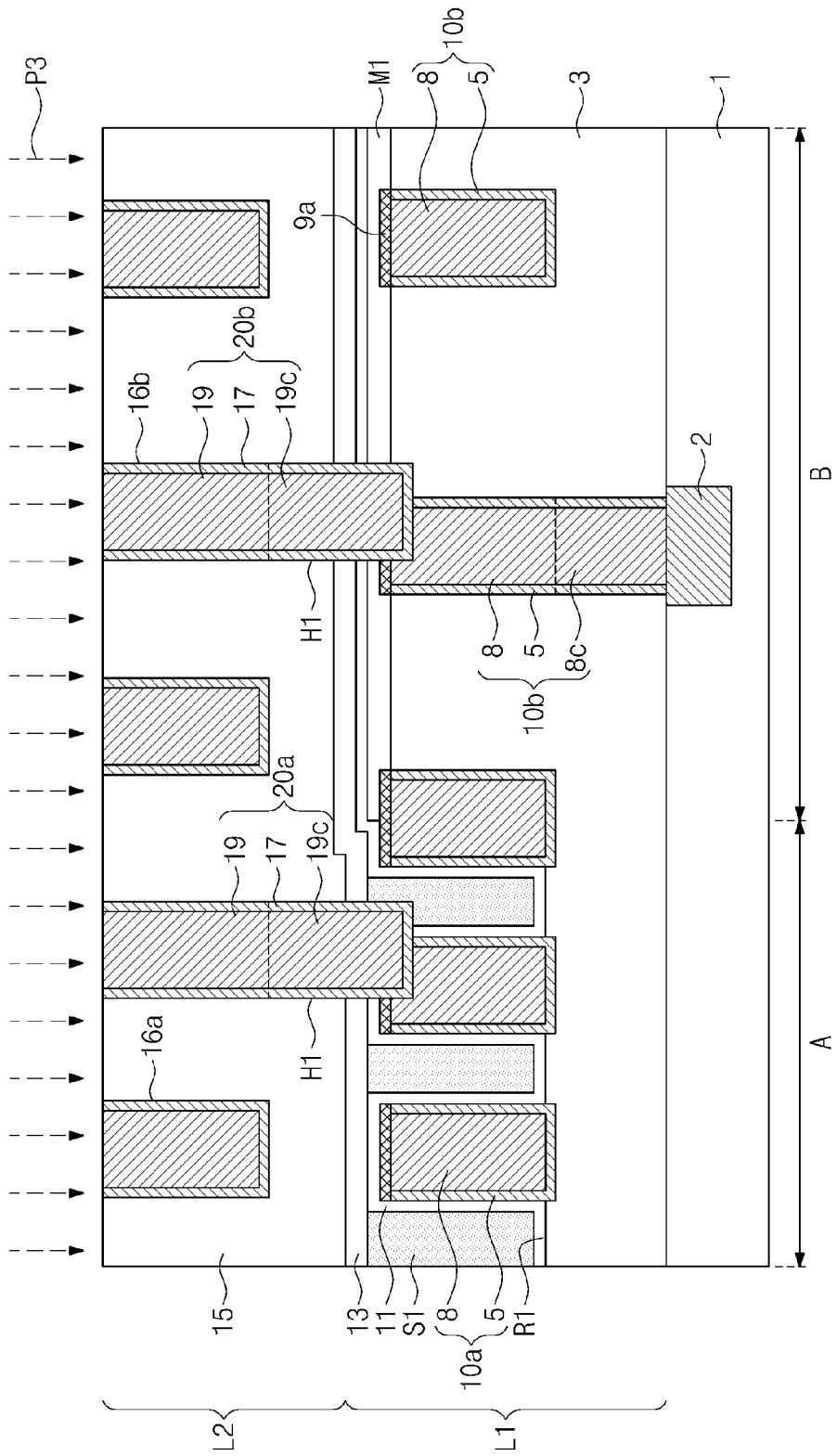

Referring to FIG. 13, a removal process P3 is performed to selectively remove the sacrificial layer S1. The removal process P3 may be an ultraviolet irradiating process. Here, an ultraviolet irradiating energy of the removal process P3 may be stronger than the ultraviolet irradiating energy of the ultraviolet irradiating process used as the hardening process P2 of FIG. 9. An electron beam as well as the ultraviolet ray may be irradiated during the removal process P3. The hydrocarbon layer of the sacrificial layer S1 may be decomposed by a volatile by-product (e.g., methane or ethane) during the removal process P3, and the decomposed hydrocarbon layer of the sacrificial layer S1 may escape outward through the permeation layer 13 and the second interlayer insulating layer 15. A process temperature of the removal process P3 may be about 400° C. The sacrificial layer S1 is removed to form the air gap region AG1 of FIG. 2. Since the ultraviolet ray travels in a straight line, direct irradiation of the ultraviolet ray to the sacrificial layer S1 adjacent to a bottom surface of the second-layer first conductive pattern 20a may be difficult. However, by diffraction, refraction and reflection effects of light, the ultraviolet ray may also be irradiated to the sacrificial layer S1 adjacent to a bottom surface of the second-layer first conductive pattern 20a.

After the formation of the air gap region AG1, a second protecting layer 21a is formed on each of the second-layer first and second conductive patterns 20a and 20b, and a second capping pattern M2 may be formed on the second interlayer insulating layer 15 as illustrated in FIG. 2. As a result, the semiconductor device of FIG. 2 may be fabricated.

Figure 14:
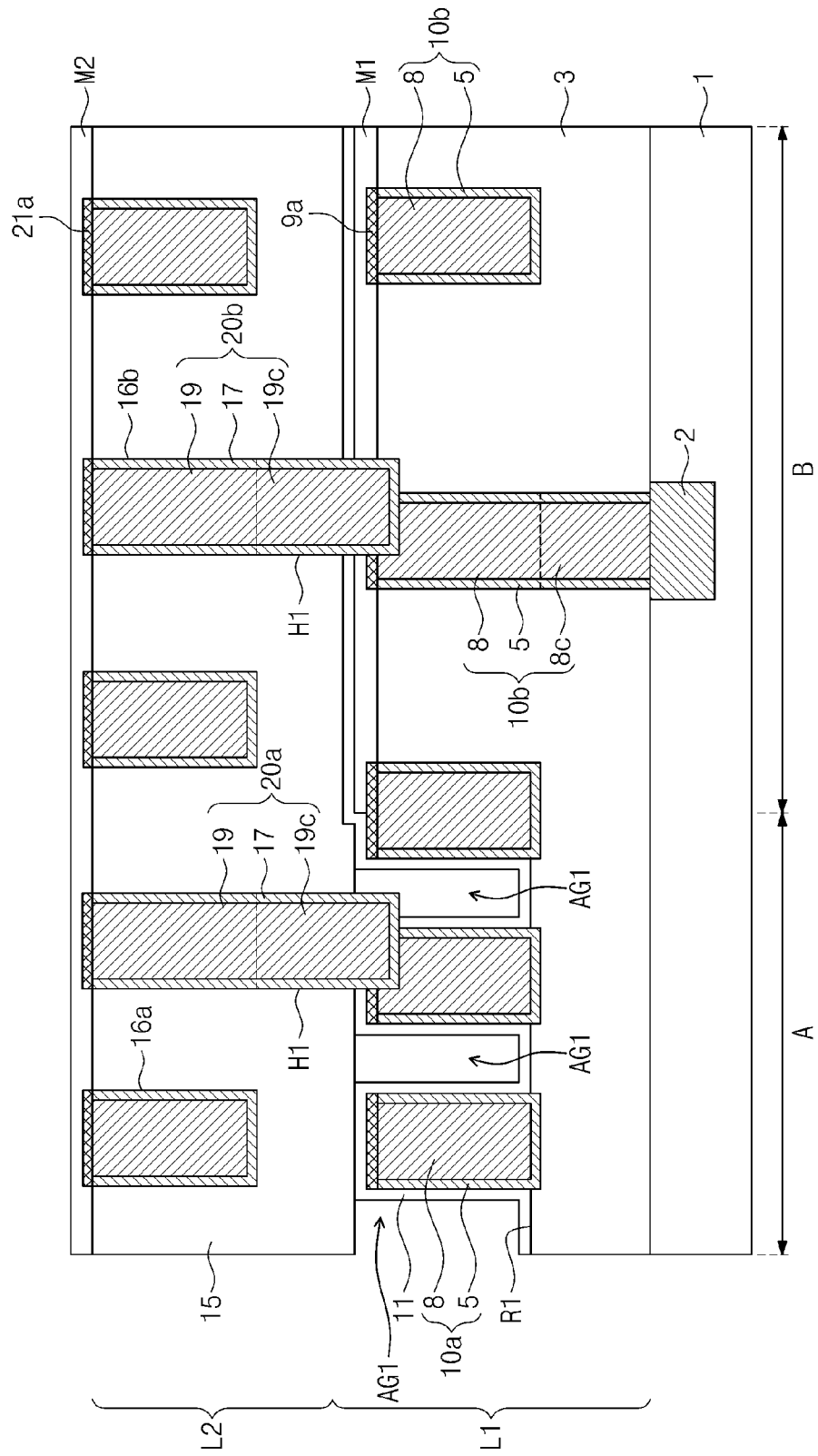
FIG. 14 is a cross-sectional view illustrating a semiconductor device according to another example embodiment of the inventive concepts.

FIG. 14 is a cross-sectional view illustrating a semiconductor device according to another example embodiment of the inventive concepts.

Referring to FIG. 14, a semiconductor device according to the present embodiment does not include the permeation layer 13 of FIG. 2. A second interlayer insulating layer 15 is in direct contact with an insulating diffusion barrier layer 11 without the permeation layer 13. An air gap region AG1 is defined between first-layer first conductive patterns 10a by a bottom surface of the second interlayer insulating layer 15 and surfaces of the insulating diffusion barrier layer 11. Other elements and manufacturing processes of the semiconductor device according to the present embodiment may be the same as or similar to corresponding elements and corresponding fabricating processes of the semiconductor device described with reference to FIGS. 2 to 13.

Figure 15:
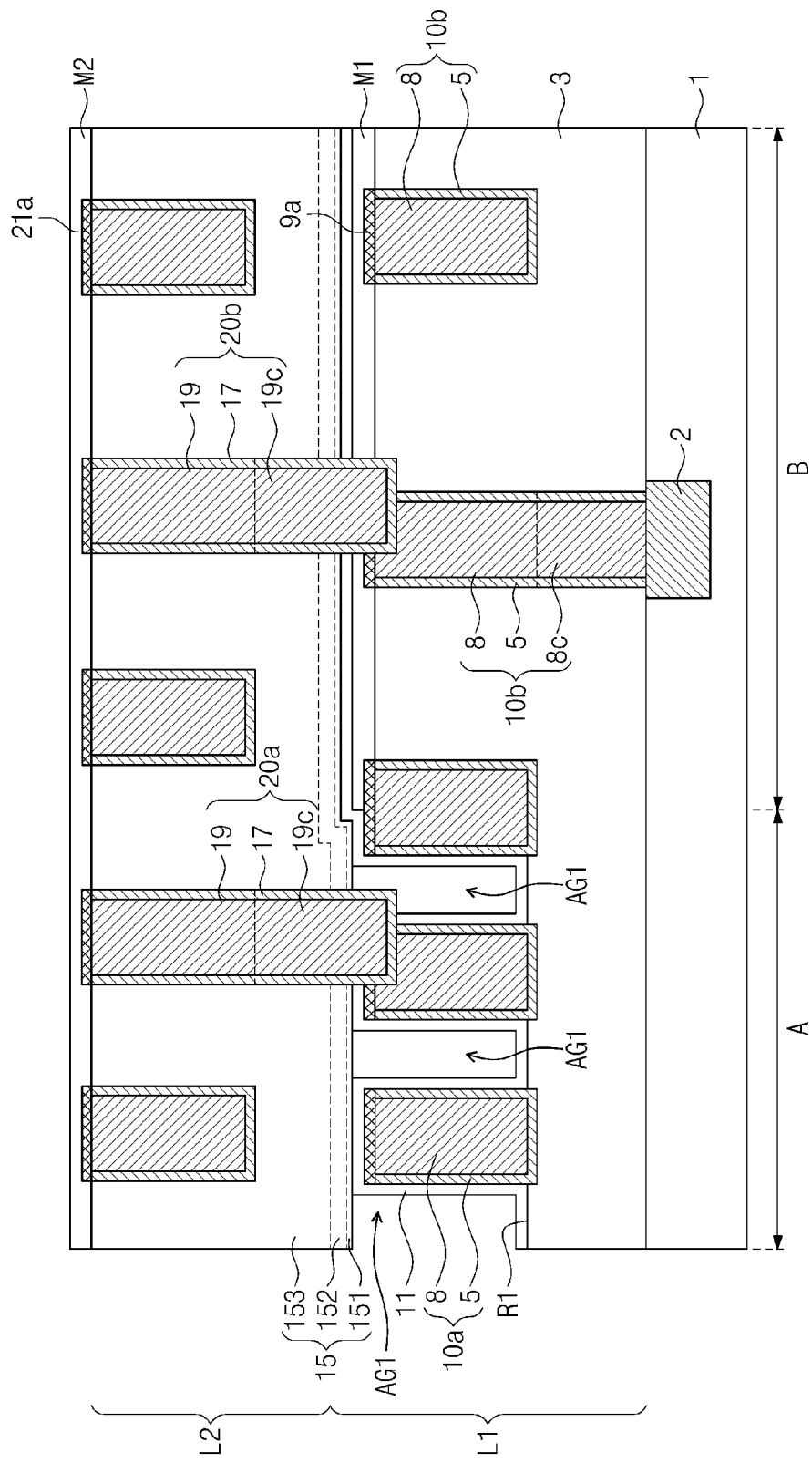
FIG. 15 is a cross-sectional view illustrating a semiconductor device according to still another example embodiment of the inventive concepts.

FIG. 15 is a cross-sectional view illustrating a semiconductor device according to still another example embodiment of the inventive concepts.

Referring to FIG. 15, in a semiconductor device according to the present embodiment, a second interlayer insulating layer 15 may include a glue layer 151, a high-density interlayer insulating layer 152, and a low-density interlayer insulating layer 153 which are sequentially stacked. The glue layer 151 may be, for example, a silicon oxide layer. The high-density interlayer insulating layer 152 and the low-density interlayer insulating layer 153 may be formed of porous SiOCH layers. At this time, a porous degree or a density of the high-density interlayer insulating layer 152 may be different from a porous degree or a density of the low-density interlayer insulating layer 153. The high-density interlayer insulating layer 152 may be thicker than the glue layer 151 but may be thinner than the low-density interlayer insulating layer 153. Other elements and manufacturing processes of the semiconductor device according to the present embodiment may be the same as or similar to corresponding elements and corresponding fabricating processes of the semiconductor device described with reference to FIG. 14.

Figure 16:
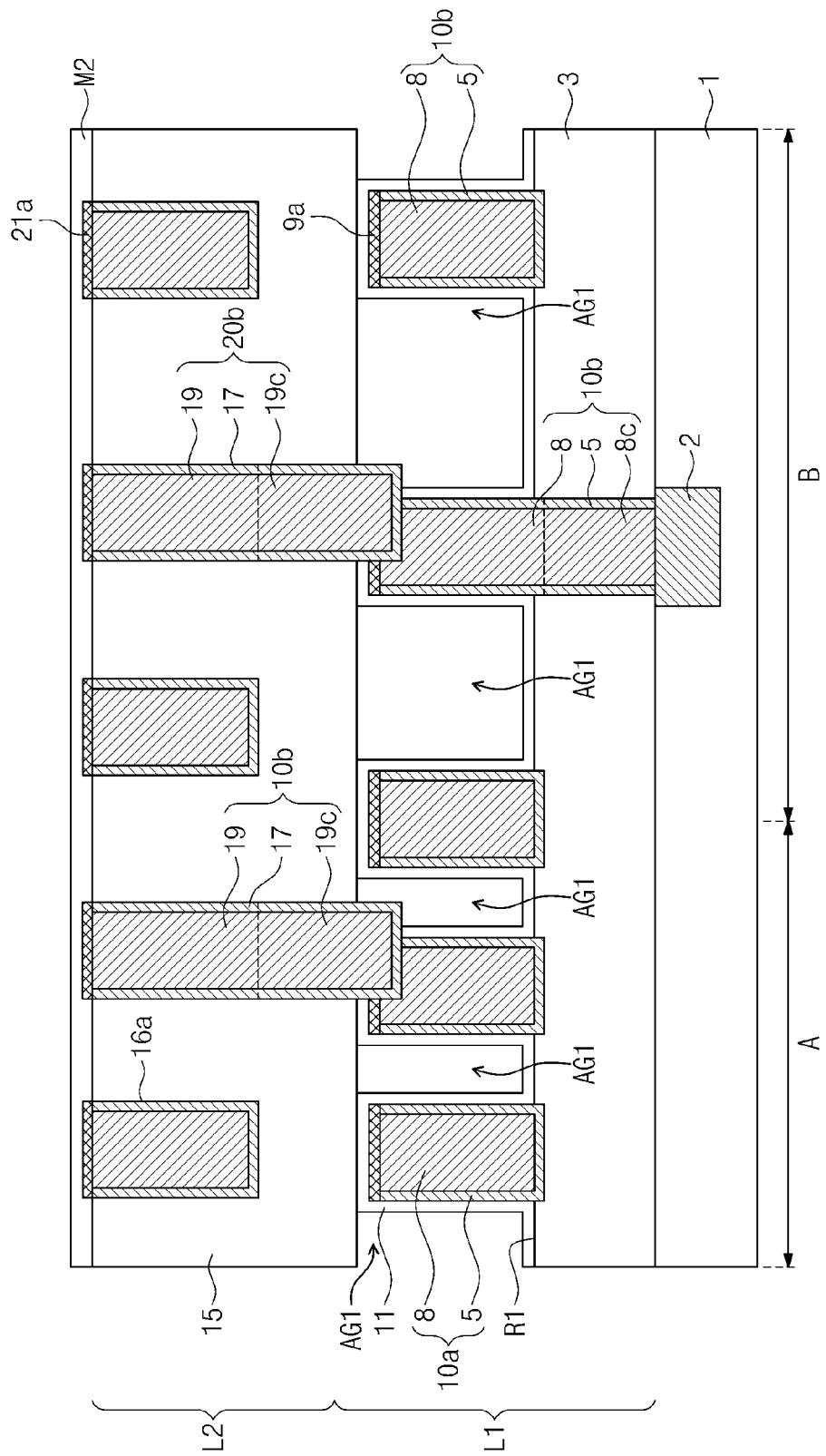
FIG. 16 is a cross-sectional view illustrating a semiconductor device according to yet another example embodiment of the inventive concepts.

FIG. 16 is a cross-sectional view illustrating a semiconductor device according to yet another example embodiment of the inventive concepts.

Referring to FIG. 16, a semiconductor device according to the present embodiment may not include the first capping pattern M1 of FIG. 2. Air gap regions AG1 may be disposed between the first-layer first conductive patterns 10a of the first region A and between the first-layer second conductive patterns 10b of the second region B, respectively. An insulating diffusion barrier layer 11 may conformally cover sidewalls of the first-layer first-layer first and second conductive patterns 10a and 10b and a top surface of the first interlayer insulating layer 3 therebetween. Other elements of the semiconductor device according to the present embodiment may be the same as or similar to corresponding elements of the semiconductor device described with reference to FIG. 2.

FIGS. 17 to 20 are cross-sectional views illustrating a method of fabricating the semiconductor device of FIG. 16.

Figure 17:
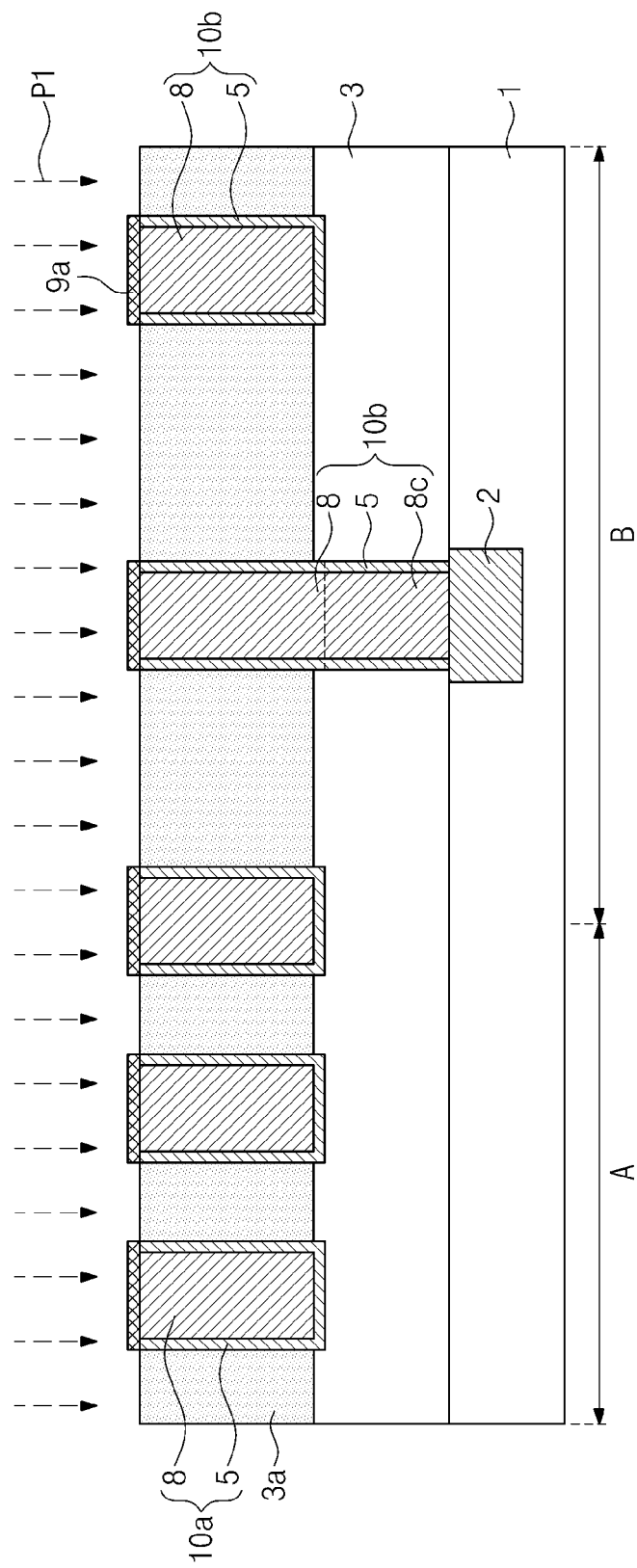
FIGS. 17 to 20 are cross-sectional views illustrating a method of fabricating the semiconductor device of FIG. 16.

Referring to FIG. 17, the plasma treatment process P1 is performed on an entire top surface of the substrate 1 of the structure illustrated in FIG. 3 without the first capping pattern M1. Thus, carbon may be removed from the first interlayer insulating layer 3 between the first-layer first and second conductive patterns 10a and 10b to form a silicon hydroxide (SiOH) layer 3a in the first and second regions A and B.

Figure 18:
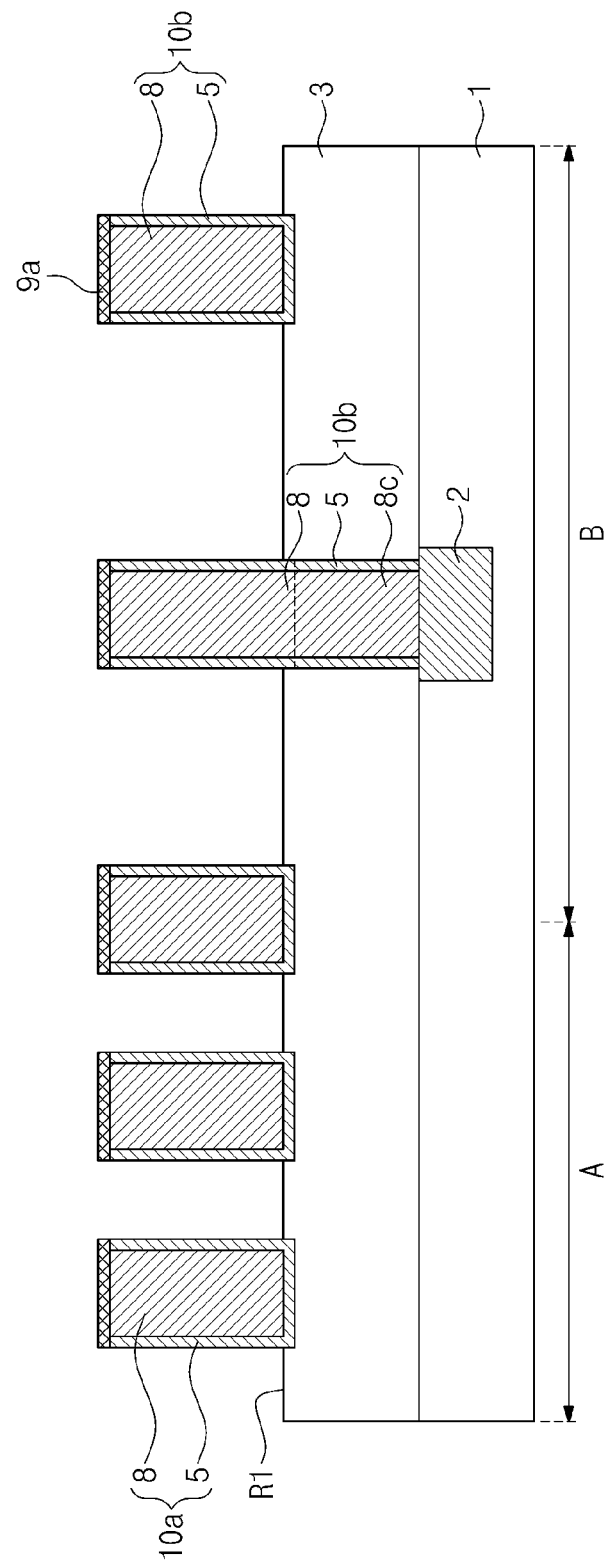

Referring to FIG. 18, the silicon hydroxide (SiOH) layer 3a may be selectively removed by hydrofluoric acid to form a recess region R1 in the first and second regions A and B.

Figure 19:
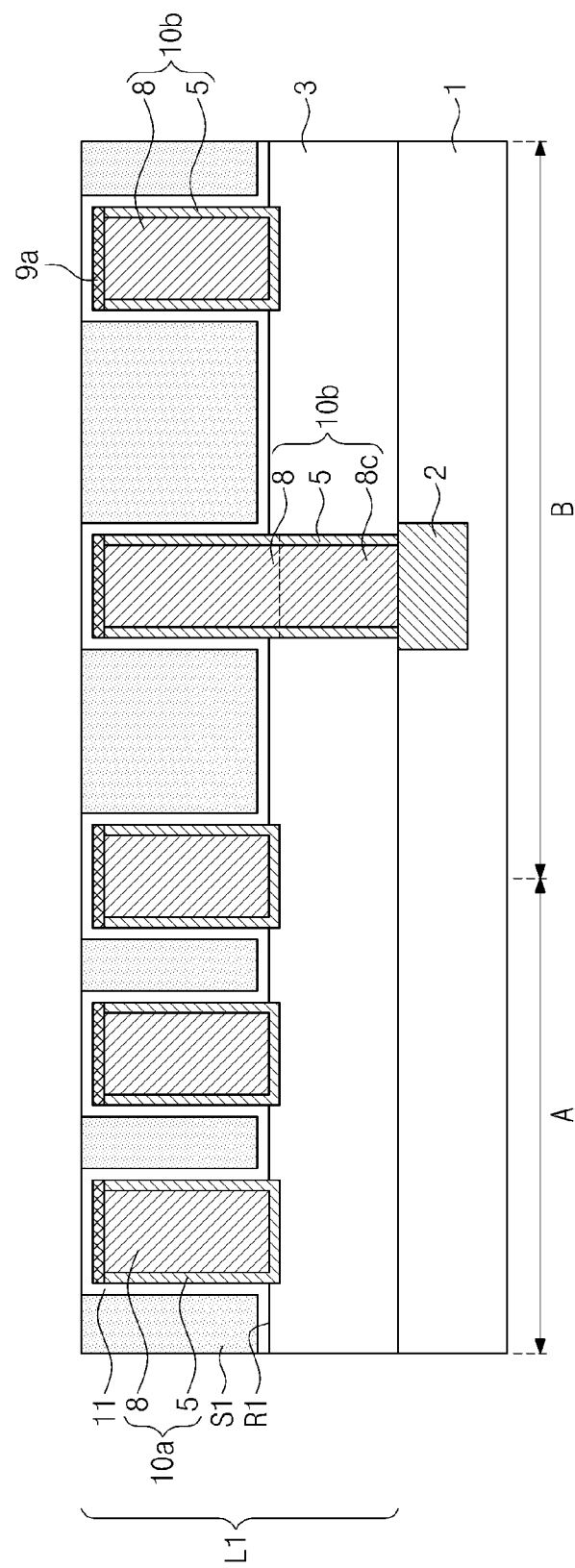

Referring to FIG. 19, an insulating diffusion barrier layer 11 is conformally formed on an entire top surface of the substrate 1. Subsequently, a sacrificial layer S1 is formed to fill each of spaces between the first-layer first and second conductive patterns 10a and 10b.

Figure 20:
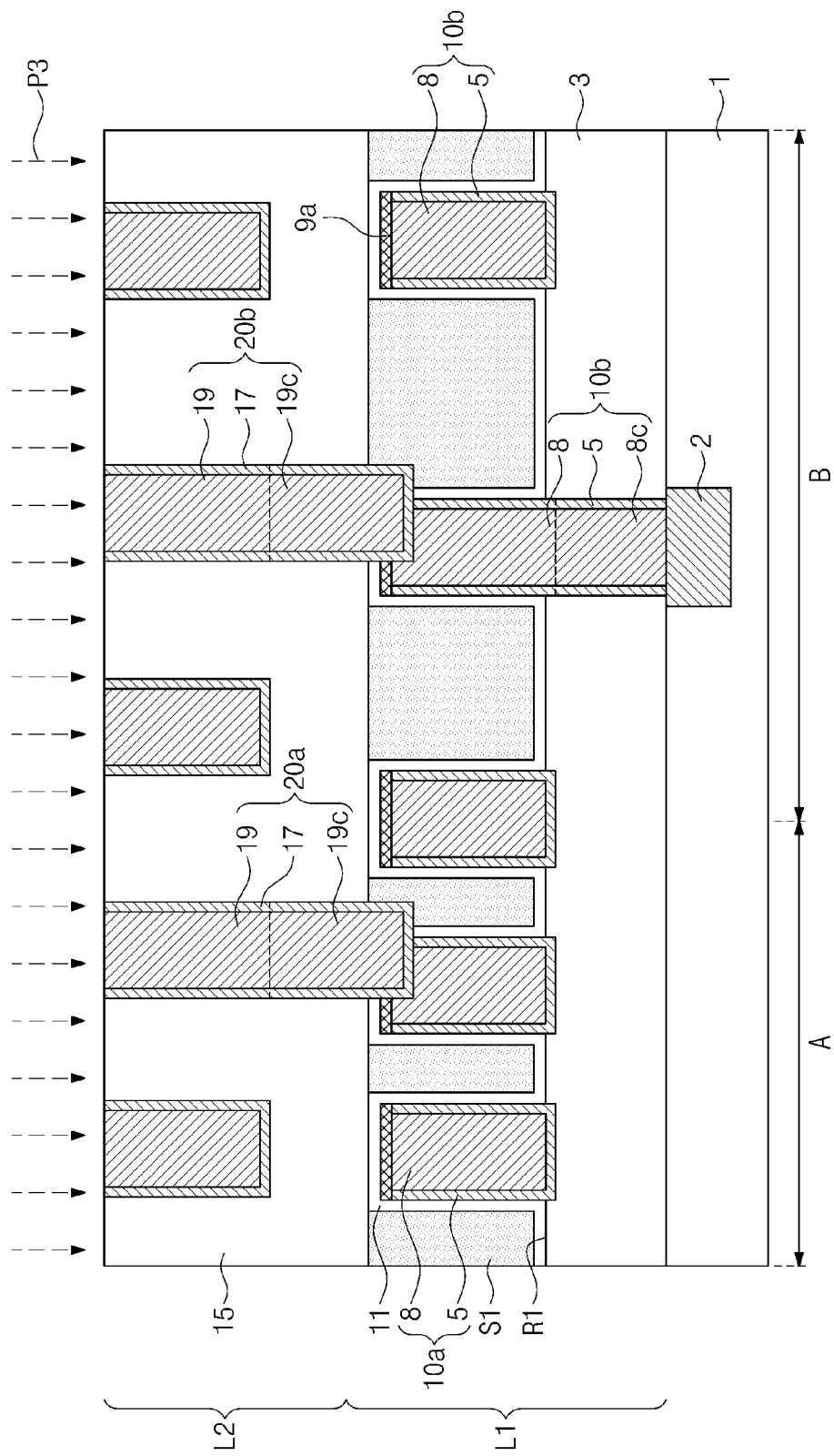

Referring to FIG. 20, a second interconnection layer L2 is formed as described with reference to FIGS. 9 to 12. Next, the removal process P3 may be performed to selectively remove the sacrificial layer S1. Other fabricating processes of the present embodiment may be the same as or similar to corresponding fabricating processes described with reference to FIGS. 3 to 13.

Figure 21:
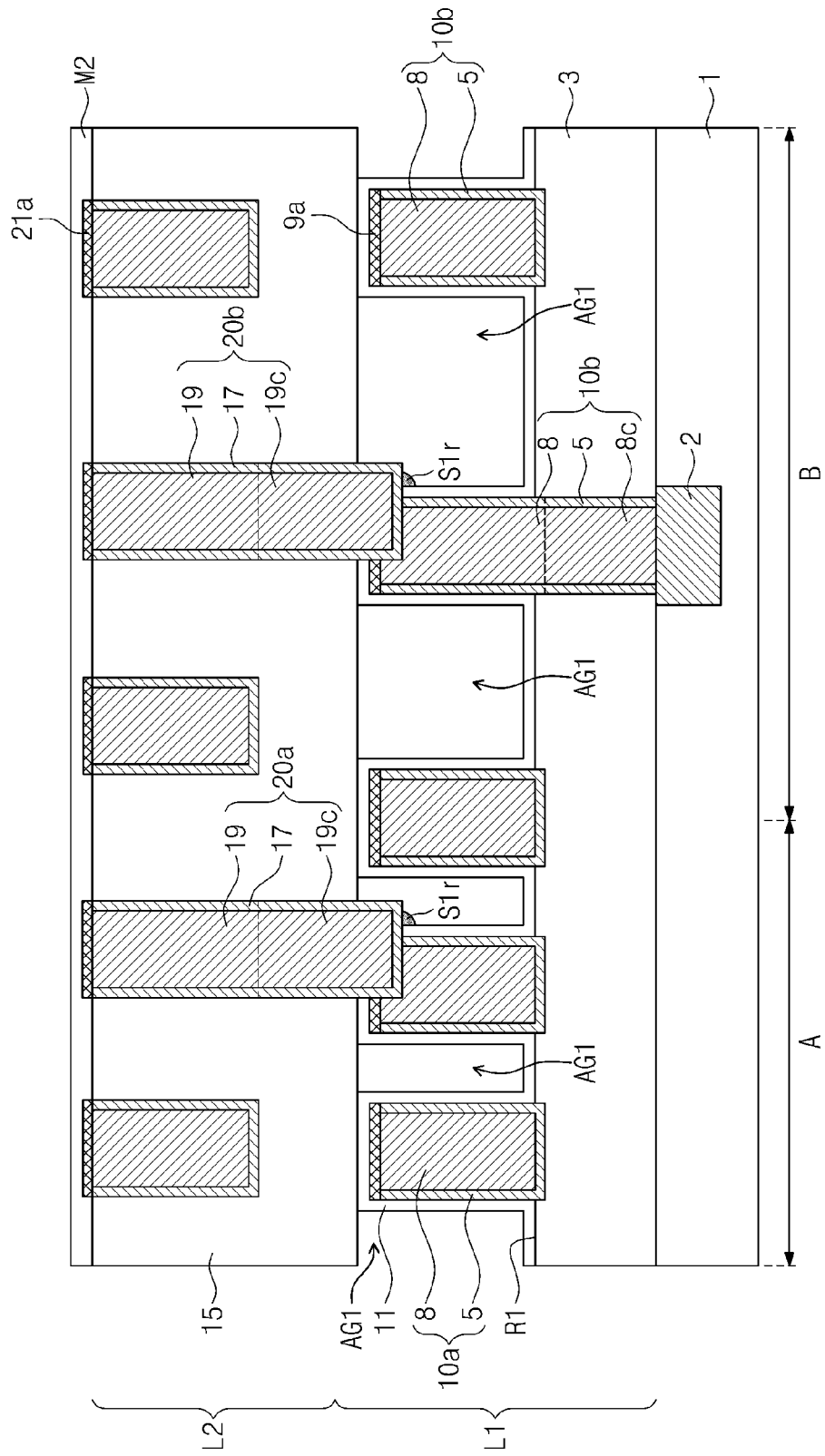
FIG. 21 is a cross-sectional view illustrating a semiconductor device according to yet still another example embodiment of the inventive concepts.

FIG. 21 is a cross-sectional view illustrating a semiconductor device according to yet still another example embodiment of the inventive concepts.

Referring to FIG. 21, in a semiconductor device according to the present embodiment, sacrificial-layer residues S1r remain on bottom surfaces of the second-layer first and second conductive patterns 20a and 20b exposed by the air gap regions AG1. The sacrificial-layer residue S1r may include the same hydrocarbon as the sacrificial layer S1. The ultraviolet ray may be difficult to irradiate to the bottom surfaces of the second-layer first and second conductive patterns 20a and 20b by the straight propagation of the ultraviolet ray during the removal process P3 of FIG. 20, so the sacrificial-layer residues S1r may remain on the bottom surfaces of the second-layer first and second conductive patterns 20a and 20b. Other elements and fabricating processes of the semiconductor device according to the present embodiment may be the same as or similar to corresponding elements and corresponding fabricating processes of the semiconductor device described with reference to FIGS. 16 to 20.

Figure 22:
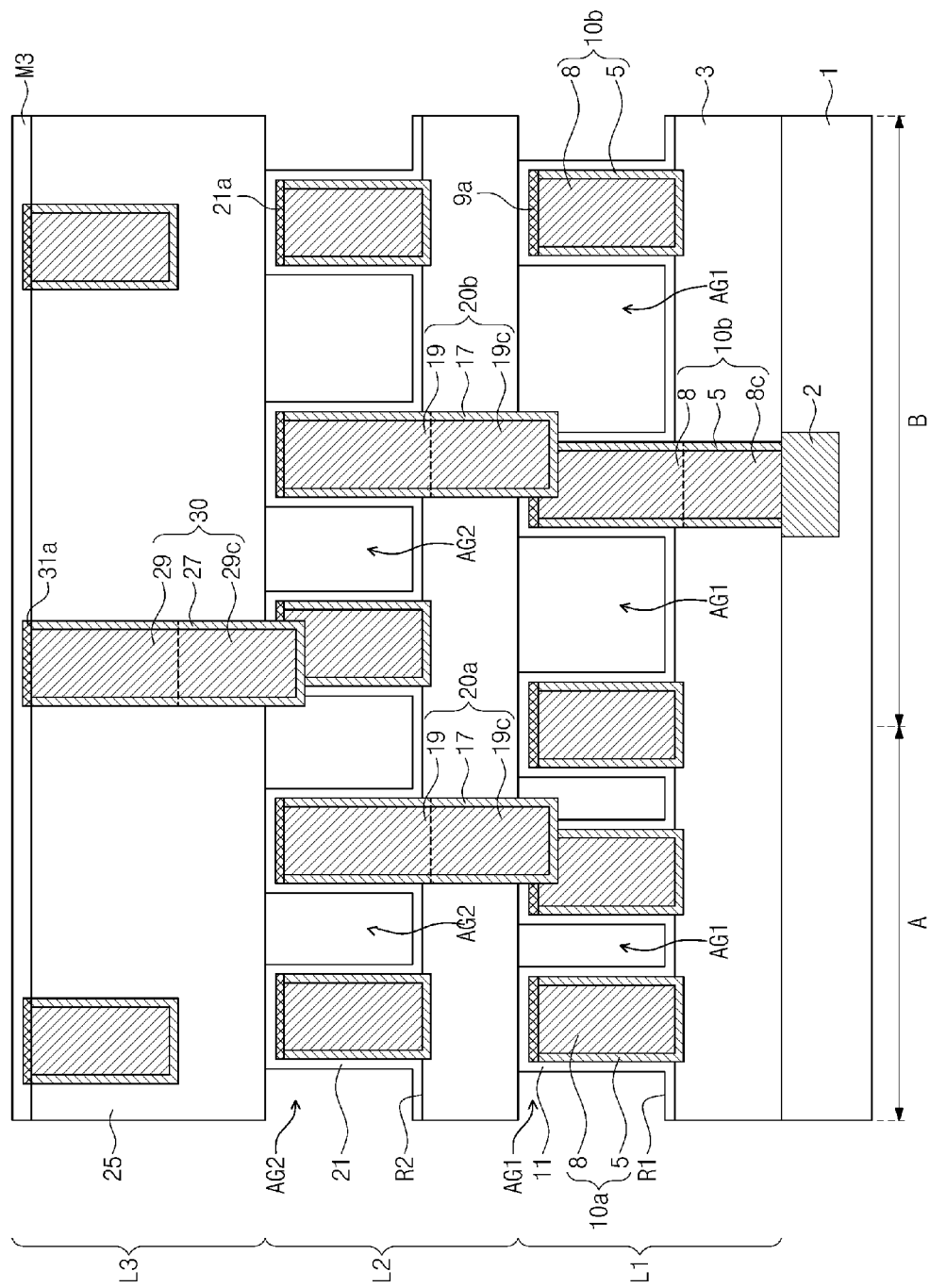
FIG. 22 is a cross-sectional view illustrating a semiconductor device according to yet still another example embodiment of the inventive concepts.

FIG. 22 is a cross-sectional view illustrating a semiconductor device according to yet still another example embodiment of the inventive concepts.

Referring to FIG. 22, a semiconductor device according to the present embodiment may include a first interconnection layer L1, a second interconnection layer L2, and a third interconnection layer L3 which are sequentially stacked on the substrate 1. The first interconnection layer L1 of the present embodiment is the same as the first interconnection layer L1 of FIG. 16. The second interconnection layer L2 of the present embodiment does not include the second capping pattern M2. A second recess region R2 is disposed in a second interconnection layer 15 of the second interconnection layer L2. A second insulating diffusion barrier layer 21 conformally covers second-layer first and second conductive patterns 20a and 20b. Second air gap regions AG2 are disposed between the second-layer first and second conductive patterns 20a and 20b. The third interconnection layer L3 includes a third interlayer insulating layer 25 and third conductive patterns 30. Each of the third conductive patterns 30 may include a third interconnection portion 29 and a third metal diffusion barrier layer 27. At least one of the third conductive patterns 30 may further include a third conductive plug 29c. A third protecting layer 31a may cover a top surface of each of the third conductive patterns 30. A third capping pattern M3 may cover a top surface of the third interlayer insulating layer 25. The third interlayer insulating layer 25 may be formed of the same material as the first and second interlayer insulating layers 3 and 15. Other elements of the semiconductor device according to the present embodiment may be the same as or similar to corresponding elements of the semiconductor device of FIG. 16.

Figure 23:
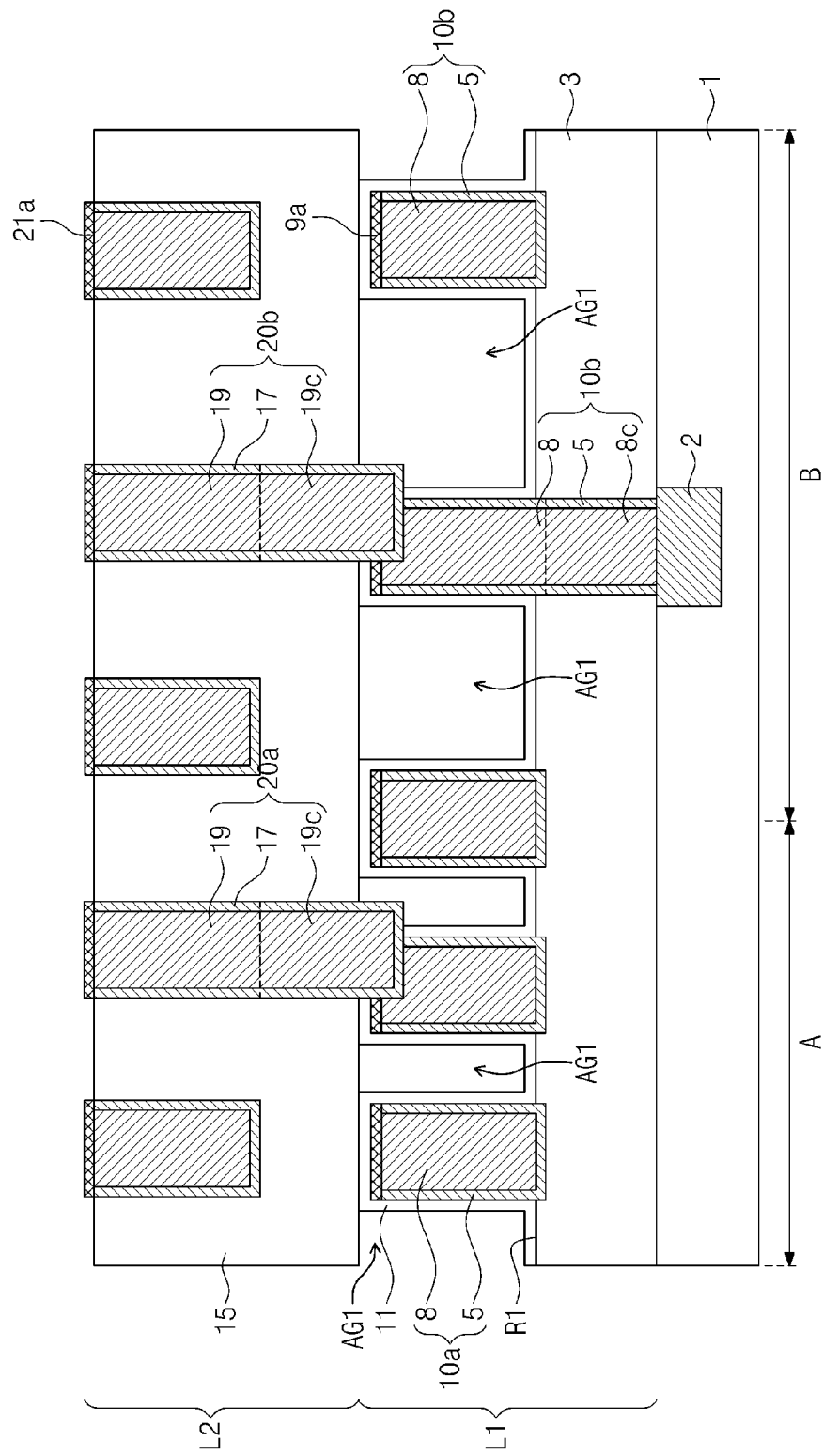
FIGS. 23 and 24 are cross-sectional views illustrating a method of fabricating the semiconductor device of FIG. 22.
Figure 24:
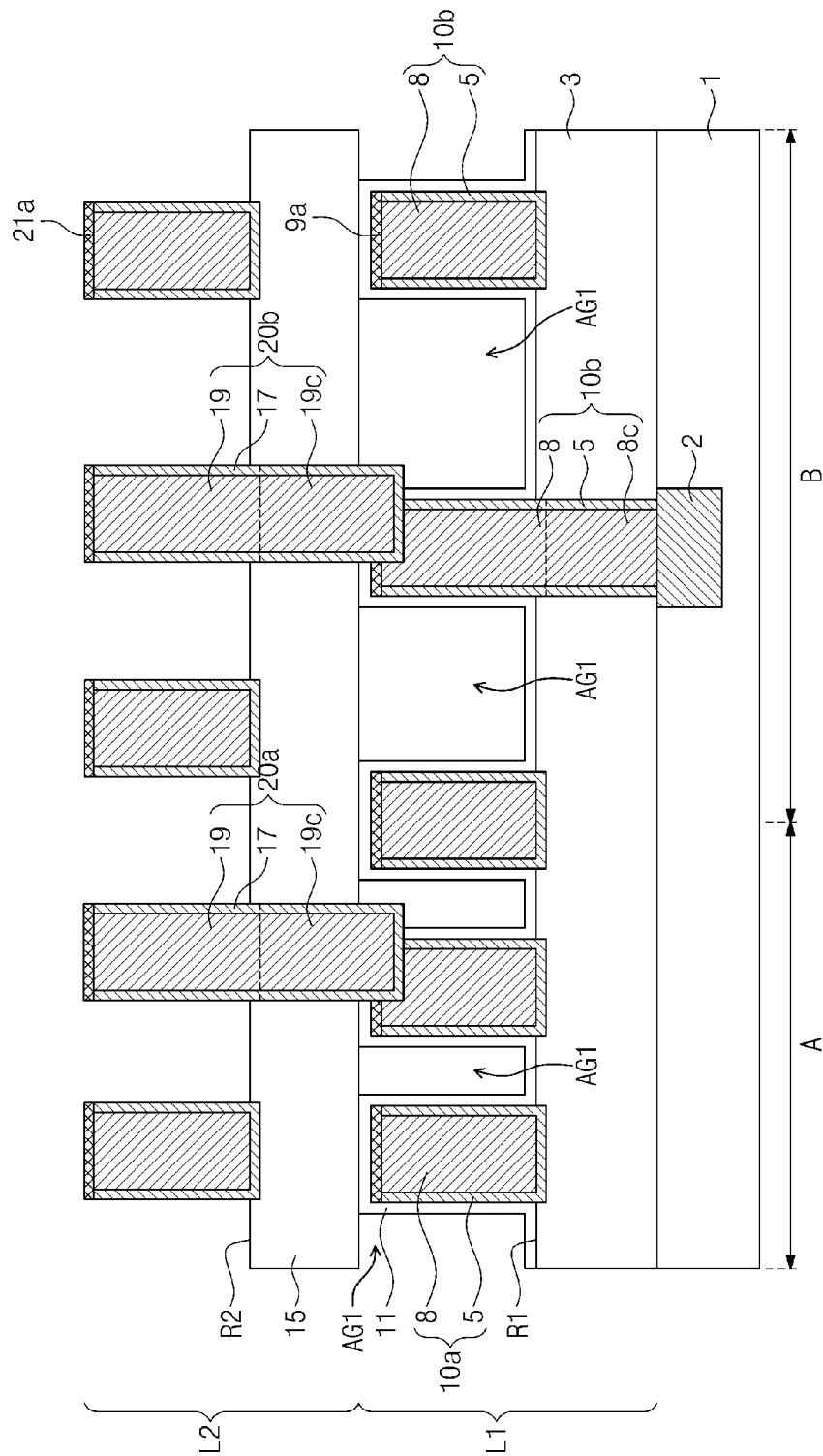

FIGS. 23 and 24 are cross-sectional views illustrating a method of fabricating the semiconductor device of FIG. 22.

Referring to FIG. 23, the sacrificial layer S1 may be removed as described with reference to FIG. 20, and then, a second protecting layer 21a is formed on the second-layer first and second conductive patterns 20a and 20b.

Referring to FIG. 24, subsequently, the plasma treatment process P1 and the wet etching process of FIG. 17 may be sequentially performed to remove a portion of the second interlayer insulating layer 15 and to form a second recess region R2. Thus, sidewalls of the second-layer first and second conductive patterns 20a and 20b are exposed.

Referring again to FIG. 22, a second sacrificial layer may be formed between the second-layer first and second conductive patterns 20a and 20b, and a third interlayer insulating layer 25 and third conductive patterns 30 are formed on the second sacrificial layer and the second-layer first and second conductive patterns 20a and 20b. The second sacrificial layer may be selectively removed to form second air gap regions AG2. A third capping pattern M3 may be formed on the third interlayer insulating layer 25.

Figure 25:
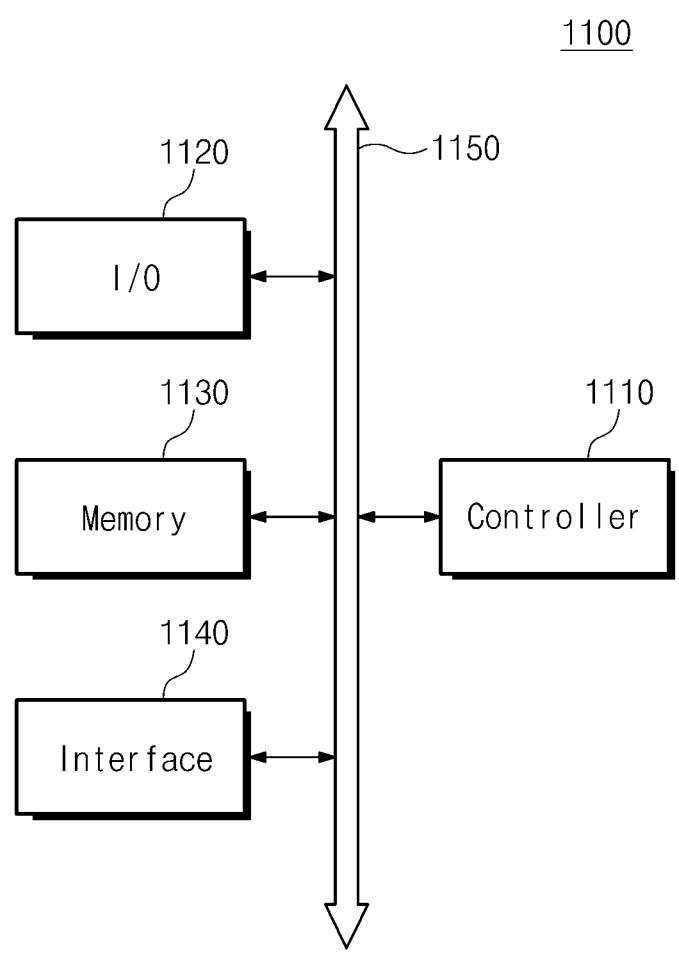
FIG. 25 is a schematic block diagram illustrating an example of a memory system including a semiconductor device according to some example embodiments of the inventive concepts.

FIG. 25 is a schematic block diagram illustrating an example of a memory system including a semiconductor device according to some example embodiments of the inventive concepts.

Referring to FIG. 25, a memory system 1100 may be applied to a personal digital assistant (PDA), a portable computer, a web tablet, a wireless phone, a mobile phone, a digital music player, a memory card or other electronic products. The other electronic products may receive or transmit information data by wireless.

The memory system 1100 may include a controller 1110, an input/output (I/O) unit 1120 (e.g., a keypad, a keyboard, and/or a display device), a memory device 1130, an interface unit 1140, and a data bus 1150. The memory device 1130 and the interface unit 1140 may communicate with each other through the data bus 1150.

The controller 1110 may include at least one of a microprocessor, a digital signal processor, a microcontroller, or other logic devices. The other logic devices may have a similar function to any one of the microprocessor, the digital signal processor, or the microcontroller. The memory device 1130 may store data and/or commands. The I/O unit 1120 may receive data or signals from an external system or may outputs data or signals to the external system.

The memory device 1130 may include a non-volatile memory device to which the features of the inventive concepts are applied. In addition, the memory device 1130 may further include another kind of a memory device and/or a randomly accessed volatile memory device.

The interface unit 1140 may transmit data to a communication network or may receive data from the communication network.

In the semiconductor device according to some embodiments of the inventive concepts, the air gap region may be disposed at a side of a lower conductive pattern being in contact with the contact/via plug. Thus, a size (or an area) of the air gap region may become wider to improve the signal transfer speed of the interconnections.

According to the method of fabricating the semiconductor device of the inventive concepts, the bridge problem does not occur even though the misalignment occurs during the formation of the contact/via plug.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
 a first conductive pattern on a substrate, the first conductive pattern including, first region conductive patterns on a first region of the substrate, and second region conductive patterns on a second region of the substrate;

an insulating diffusion barrier layer conformally covering a surface of the first conductive pattern, the insulating diffusion barrier layer exposed by an air gap region adjacent to a sidewall of the first region conductive patterns;

a lower interlayer insulating layer filling a space between the second region conductive patterns;

a capping pattern on the lower interlayer insulating layer and the second region conductive patterns; and a second conductive pattern on the first conductive pattern, the second conductive pattern penetrating the insulating diffusion barrier layer so as to be in contact with the first conductive pattern, wherein a portion of a bottom surface of the second conductive pattern is exposed by the air gap region, and wherein the capping pattern does not cover the first region conductive patterns.

2. The semiconductor device of claim 1, further comprising:

a permeation layer on the insulating diffusion barrier layer; and an upper interlayer insulating layer on the permeation layer and in contact with a sidewall of the second conductive pattern, wherein the upper interlayer insulating layer includes a porous layer.

3. The semiconductor device of claim 2, wherein the upper interlayer insulating layer includes a porous silicon oxy hydrocarbon (SiOCH) layer.

4. The semiconductor device of claim 1, wherein the first region conductive patterns are laterally spaced apart from each other at a first distance, the second region conductive patterns are laterally spaced apart from each other at a second distance greater than the first distance, and the air gap region is between the first region conductive patterns.

5. The semiconductor device of claim 1, wherein a mechanical strength of the capping pattern is stronger than a mechanical strength of the lower interlayer insulating layer.

6. The semiconductor device of claim 1, wherein at least a portion of the second conductive pattern vertically overlaps the air gap region.

7. The semiconductor device of claim 1, wherein the first conductive pattern includes a first interconnection portion and a first metal diffusion barrier layer conformally covering at least a sidewall of the first interconnection portion, and the second conductive pattern includes a second interconnection portion and a second metal diffusion barrier layer surrounding a sidewall and a bottom surface of the second interconnection portion.

8. A semiconductor device comprising:

a plurality of first conductive patterns on a substrate, the plurality of first conductive patterns including, a plurality of first region conductive patterns on a first region of the substrate, the plurality of first region conductive patterns including air gap regions between adjacent ones of the first region conductive patterns, and a plurality of second region conductive patterns on a second region of the substrate, the plurality of second region conductive patterns including a porous layer therebetween;

a plurality of second conductive patterns over at least the plurality of first region conductive patterns, at least one of the plurality of second conductive patterns in contact with at least one of the plurality of first region conductive patterns; and a capping pattern on the plurality of second region conductive patterns and exposing the plurality of first region conductive patterns.

9. The semiconductor device of claim 8, further comprising:

an insulating diffusion barrier layer conformally covering at least one surface of the plurality of first region conductive patterns, wherein the insulating diffusion barrier layer and a portion of a bottom surface of the second conductive pattern in contact with the first region conductive patterns are exposed by the air gap regions between the plurality of first region conductive patterns.

10. The semiconductor device of claim 8, wherein the porous layer between the plurality of second region conductive patterns is a porous silicon oxy hydrocarbon (SiOCH) layer.

11. The semiconductor device of claim 8, further comprising:

a permeation layer on the insulating diffusion barrier layer; and an upper interlayer insulating layer on the permeation layer and in contact with a sidewall of the plurality of second conductive patterns, wherein the upper interlayer insulating layer includes a porous silicon oxy hydrocarbon (SiOCH) layer.

12. The semiconductor device of claim 8, wherein the plurality of first region conductive patterns are laterally spaced apart from each other at a first distance, and the plurality of second region conductive patterns are laterally spaced apart from each other at a second distance greater than the first distance.

13. The semiconductor device of claim 8, wherein at least a portion of the second conductive pattern in contact with the first region conductive pattern vertically overlaps the air gap regions.

14. The semiconductor device of claim 8, wherein at least one of the first conductive patterns includes a first interconnection portion and a first metal diffusion barrier layer conformally covering at least a sidewall of the first interconnection portion, and at least one of the plurality of second conductive patterns includes a second interconnection portion and a second metal diffusion barrier layer surrounding a sidewall and a bottom surface of the second interconnection portion.

* * * * *